United States Patent
Fukuda

(10) Patent No.: US 7,859,897 B2
(45) Date of Patent: Dec. 28, 2010

(54) SEMICONDUCTOR MEMORY DEVICE AND DRIVING METHOD THEREOF

(75) Inventor: Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 97 days.

(21) Appl. No.: 12/402,030

(22) Filed: Mar. 11, 2009

(65) Prior Publication Data

US 2009/0251959 A1    Oct. 8, 2009

(30) Foreign Application Priority Data

Apr. 2, 2008    (JP) ............... 2008-096342

(51) Int. Cl.
*G11C 7/00* (2006.01)
(52) U.S. Cl. .................... 365/174; 365/158
(58) Field of Classification Search ............. 365/174, 365/158
See application file for complete search history.

(56) References Cited

U.S. PATENT DOCUMENTS

| 7,355,887 | B2 * | 4/2008 | Nakamura et al. | 365/185.02 |
| 7,369,433 | B2 * | 5/2008 | Toda | 365/185.03 |
| 7,457,164 | B2 * | 11/2008 | Ohta | 365/185.22 |
| 7,474,570 | B2 * | 1/2009 | Yamada | 365/189.11 |
| 7,486,111 | B2 * | 2/2009 | Madurawe | 326/38 |
| 7,522,452 | B2 * | 4/2009 | Shiga | 365/185.09 |

OTHER PUBLICATIONS

Takashi Ohsawa et al., "Design of a 128-Mb SOI DRAM Using the Floating Body Cell (FBC)", IEEE Journal of Solid-State Circuits, vol. 41, No. 1, Jan. 2006, pp. 135-145.
Takashi Ohsawa et al., "An 18.5ns 128Mb SOI DRAM with a Floating Body Cell", IEEE International Solid-State Circuits Conference 2005, Session 25, Dynamic Memory 25.1, 3 pages.

* cited by examiner

*Primary Examiner*—Michael T Tran
(74) *Attorney, Agent, or Firm*—Oblon, Spivak, McClelland, Maier & Neustadt, L.L.P.

(57) ABSTRACT

A memory includes: memory cells including floating bodies, wherein in a data holding state, a potential of the first gate electrode is set to be higher than one of potentials of the source and drain layer and lower than the other of the potentials of the source and drain layer so that electric charges flow in the body region, and a potential of the second gate electrode is set to be higher as an absolute value than those of potentials of the source layer, drain layer, and first gate electrode so that electric charges flow from the body region, and in the data holding state, the memory cell is kept in a stationary state that a first amount of the electric charges flowing in the body region per unit time is substantially the same as a second amount of the electric charges flowing from the body region per unit time.

20 Claims, 16 Drawing Sheets

FIG. 16  FIFTH EMBODIMENT

SEMICONDUCTOR MEMORY DEVICE AND DRIVING METHOD THEREOF

CROSS-REFERENCE TO RELATED APPLICATIONS

This application is based upon and claims the benefit of priority from the prior Japanese Patent Application No. 2008-96342, filed on Apr. 2, 2008, the entire contents of which are incorporated herein by reference.

BACKGROUND OF THE INVENTION

1. Field of the Invention

The present invention relates to a semiconductor memory device and a driving method thereof and in particular to an FBC (Floating Body Cell) memory that stores information by accumulating majority carriers in the floating body of a field effect transistor.

2. Related Art

SRAMs (Static Random Access Memories) used for cache memories in processors have problems of decreased operation margins because of low voltage operations and large DC consumption currents. If the thickness of gate oxide film of a transistor used in the processor is about 1 nm, a gate tunnel current cannot be ignored. In secondary cache memories expected to have a large capacity, DRAMs (Dynamic RAMs) are used instead of the SRAM or the gate oxide film of the SRAM is made thicker than that of the transistor in the processor.

However, the DRAM requires a refresh operation and cannot be accessed during the refresh operation. Its refresh busy rate is thus increased, resulting in a decrease in performance.

SUMMARY OF THE INVENTION

A semiconductor memory device according to an embodiment of the present invention comprises: a semiconductor layer; a source layer and a drain layer within the semiconductor layer; an electrically floating body region provided between the source layer and the drain layer in the semiconductor layer and accumulating or releasing electric charges to store logical data; a first gate dielectric film provided on a first surface of the body region; a first gate electrode provided on the first surface via the first gate dielectric film; a second gate dielectric film provided on a second surface of the body region different from the first surface; a second gate electrode provided on the second surface via the second gate dielectric film; a driver applying a potential to the source layer; and a sense amplifier reading or writing the logical data from or in a memory cell including the source layer, drain layer, and body region, wherein in a data holding state, a potential of the first gate electrode is set to be higher than one of potentials of the source layer and the drain layer and lower than the other of the potentials of the source layer and the drain layer so that electric charges flow in the body region, and a potential of the second gate electrode is set to be higher as an absolute value than those of potentials of the source layer, drain layer, and first gate electrode so that electric charges flow from the body region, and in the data holding state, the memory cell is kept in a stationary state that a first amount of the electric charges flowing in the body region per unit time is substantially the same as a second amount of the electric charges flowing from the body region per unit time.

A driving method of a semiconductor memory device according to an embodiment of the present invention comprises: a source layer and a drain layer within the semiconductor layer; an electrically floating body region provided between the source layer and the drain layer in the semiconductor layer; a first gate electrode provided on a first surface of the body region so as to be insulated from the body region; a second gate electrode provided on a second surface of the body region different from the first surface so as to be insulated from the body region, the method comprising:

setting a potential of the first gate electrode to be higher than one of potentials of the source layer and the drain layer and lower than the other of the potentials of the source layer and the drain layer so that electric charges flow in the body region, and setting a potential of the second gate electrode to be higher as an absolute value than those of potentials of the source layer, drain layer, and first gate electrode so that electric charges flow from the body region, in a data holding state, and keeping the memory cell in a stationary state that a first amount of the electric charges flowing in the body region per unit time is substantially the same as a second amount of the electric charges flowing from the body region per unit time, in the data holding state.

DETAILED DESCRIPTION OF THE INVENTION

Embodiments of the present invention will be explained below in detail with reference to the accompanying drawings. Note that the invention is not limited thereto.

First Embodiment

Figure 1:
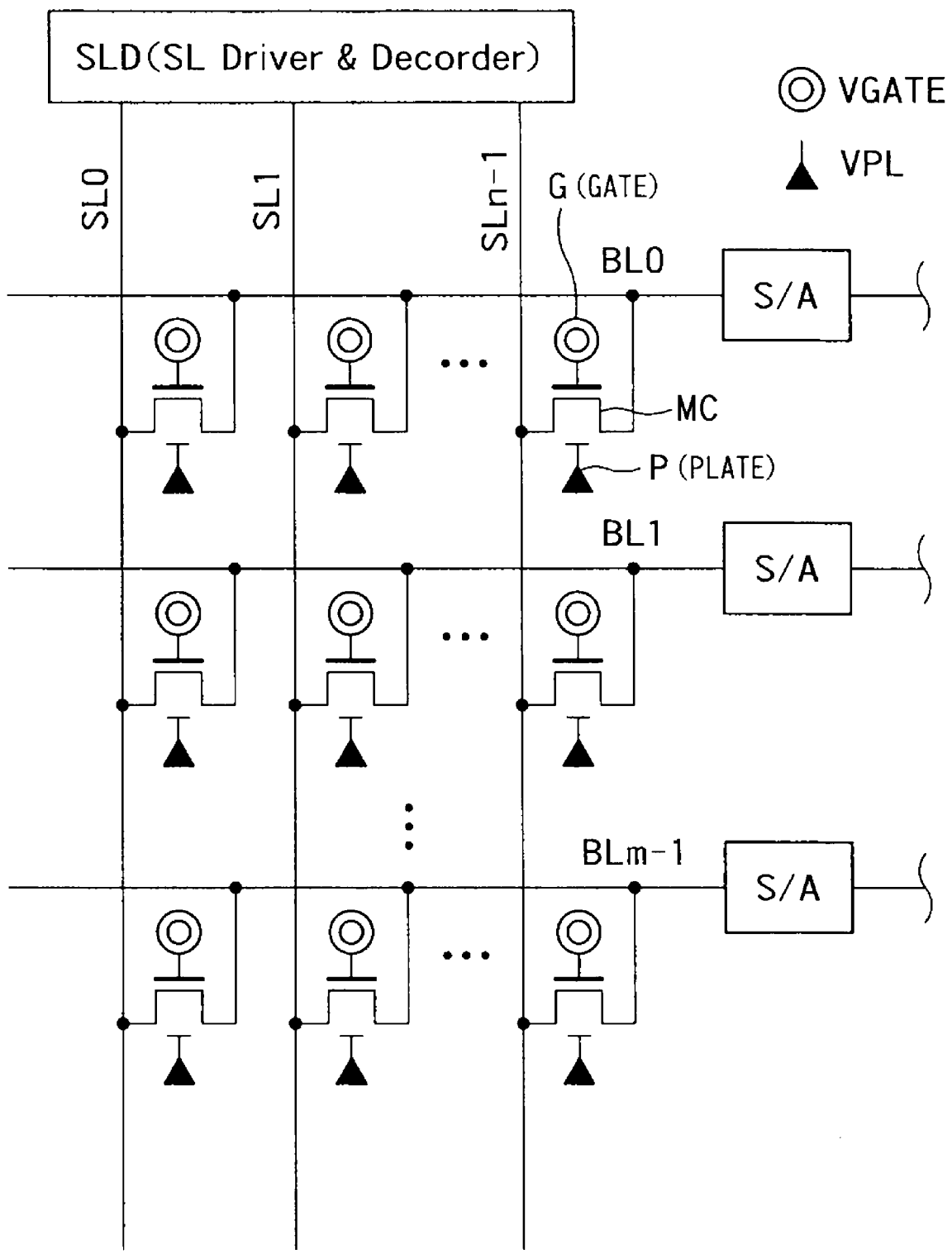
FIG. 1 is a circuit diagram showing an example of an SRAM according to a first embodiment of the present invention.

FIG. 1 is a circuit diagram showing an example of an SRAM according to a first embodiment of the present invention. In the first embodiment, an FBC (Floating Body Cell) is used for the SRAM. According to the FBC memory, an FET (Field Effect Transistor) having a floating body (also called body hereinafter) is formed on an SOI (Silicon On Insulator) substrate. Data "1" or "0" is stored depending on the number of majority carriers accumulated in the body. For example, the data "1" refers as to a state that a large number of holes are accumulated in the body of an FBC formed of an N-type FET. The data "0" refers to as a state that fewer holes are accumulated therein. A memory cell storing the data "0" is called a "0" cell, while a memory cell storing the data "1" is called a "1" cell. The FBC is suitable for downscaling because it forms a memory cell with a single transistor without a capacitor.

The SRAM of the first embodiment includes memory cells MC arranged in an n×m (n and m are natural numbers) matrix, bit lines BL0 to BLm connected to drain layers D of the memory cells MC, and source lines SL0 to SLn connected to source layers S of the memory cells MC. The bit lines BL0 to BLm (hereinafter, simply BL) are connected to the corresponding sense amplifiers S/A. The sense amplifier S/A reads and writes logical data from and to the memory cells MC. The source lines SL0 to SLn (hereinafter, simply SL) are connected to a source line decoder and source line driver SLD (hereinafter, source line driver SLD). The source line driver SLD selects any of the source lines SL and applies a potential different from those of other source lines SL to the selected source line SL. The source lines SL are substantially perpendicular to the bit lines BL.

While the memory cell array is usually provided on the both sides of the sense amplifier S/A so as to be symmetrical, the right side memory cell array is omitted in FIG. 1. Reference cells for generating reference data used for data detection are also omitted.

Figure 2:
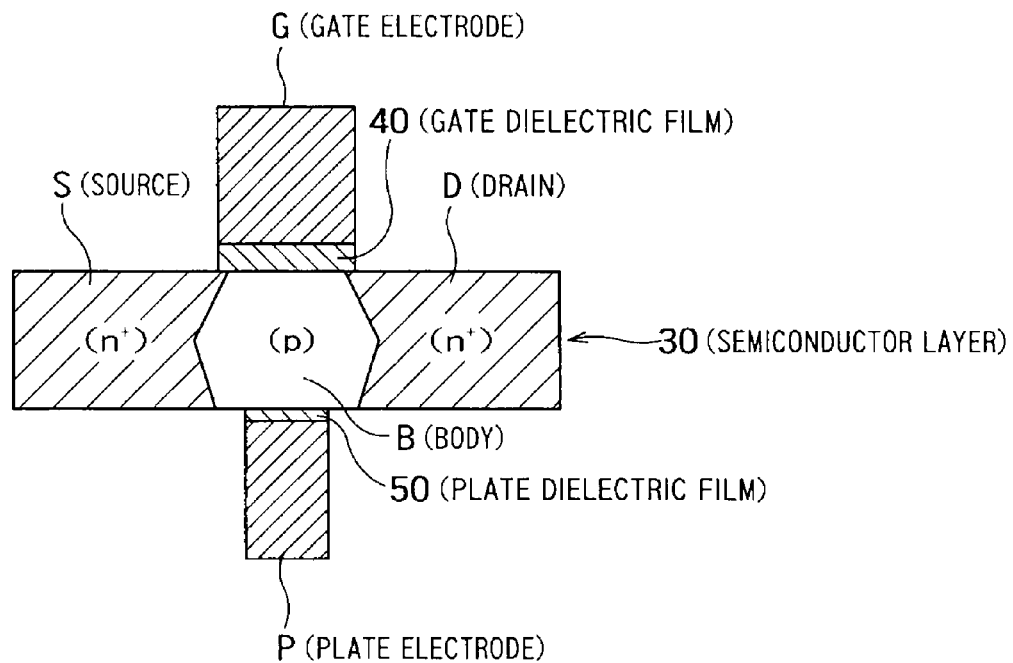
FIG. 2 is a cross-sectional view showing an example of configuration of the FBC according to the first embodiment.

FIG. 2 is a cross-sectional view showing an example of configuration of the FBC according to the first embodiment. The memory cell MC includes the source layer S and the drain layer D formed in a semiconductor layer 30 and an electrically floating body B that is provided between the source layer S and the drain layer D in the semiconductor layer 30 and accumulates or releases electric charges for storing the logical data.

The body B is the opposite dielectric semiconductor to the source layer S and the drain layer D. For example, the body B is a p-type semiconductor, while the source layer S and the drain layer D are n-type semiconductors. In the first embodiment, the memory cell MC is an N-type FET. The body B is electrically floating because it is entirely or partially surrounded by the source layer S, the drain layer D, a gate dielectric film (first gate dielectric film) 40, a plate dielectric film (second gate dielectric film) 50, and an STI (Shallow Trench Isolation) (not shown). The FBC memory stores the logical data (binary data) depending on the number of majority carriers in the body B.

The gate dielectric film 40 is formed on the top surface (first surface) of the body B. The plate dielectric film 50 is provided on the bottom surface (second surface), which is opposite to the top surface, of the body B. A gate electrode (first gate electrode) G is provided above the top surface of the body B with the gate dielectric film 40 interposed therebetween. A plate electrode (second gate electrode) P is provided below the bottom surface of the body B with the plate dielectric film 50 interposed therebetween. According to the first embodiment, the plate electrode P can be embedded in a BOX layer of the SOI substrate or can be provided on one side surface of a Fin FBC. In the case of the Fin FBC, the gate dielectric film 40 is on one side surface of a Fin semiconductor layer, while the plate dielectric film 50 on the other side surface.

The plate electrode P applies a deep negative potential to the body B so as to supply electrons to the body B by the tunneling phenomenon of the plate dielectric film 50. The thickness of the plate dielectric film 50 is thus preferably as thin as that of the gate dielectric film 40 or thinner. The thickness of the plate dielectric film 50 is such that a direct tunnel current can flow between the body B and the plate electrode P. For example, the thickness (EOT (Equivalent Oxide Thickness)) of the plate dielectric film 50 is equal to or less than 3 nm. If the thickness of the plate dielectric film 50 is the same as that of the gate dielectric film 40, the gate dielectric film 40 and the plate dielectric film 50 are formed simultaneously in the Fin FBC. If the plate dielectric film 50 is made so as to have the same thickness as the gate dielectric film 40, the Fin FBC memory is manufactured advantageously easily.

If the plate electrode P overlaps a body-source junction or body-drain junction with the plate dielectric film 50 interposed therebetween, GIDL (Gate Induced Drain Leakage) occurs when a potential difference is applied between the source and drain. According to the GIDL, when the potential of the plate electrode P is negative and the potential of the source layer S or the drain layer D is positive, holes flow in the body B by body-source or body-drain band-to-band tunneling. If the holes are supplied to the body B of the "0" cell, the data of the "0" cell can be deteriorated. To address such a problem, an end of the plate electrode P is preferably made not to overlap (oppose) the source layer S and the drain layer D. That is, the plate electrode P preferably opposes only the second surface of the body B. On the other hand, the gate electrode G must overlap (oppose) the source layer S and the drain layer D so that the memory cell MC functions as a transistor.

In the first embodiment, the potential of the gate electrode G is equal for (common to) all memory cells MC. The potential of the plate electrode P is also equal for (common to) all memory cells MC. The potential of the gate electrode G is fixed, while the potential of the plate electrode P is also fixed in the first embodiment. The gate electrode G and the plate electrode P thus can be shortened for all memory cells. The gate electrode G and the plate electrode P are made easily and word line drivers and plate line drivers are not necessary.

According to the first embodiment, when the data of the memory cell MC is read, only one source line SL corresponding to an external address input to the SRAM is selectively activated. The data of the memory cell MC connected to the activated selected source line SL is detected by the sense amplifier S/A through the bit line BL and then read. Further, the data in the sense amplifier S/A selected by the external address is read externally.

When the data is written in the memory cell MC, only one source line SL corresponding to an external address input to the SRAM is selectively activated. The data of the memory cell MC connected to the activated selected source line SL is detected by the sense amplifier S/A through the bit line BL and then read. The data in the sense amplifier S/A selected by the external address is rewritten to input data. The sense amplifier S/A then writes the resulting data back in the memory cell MC.

Figure 3:
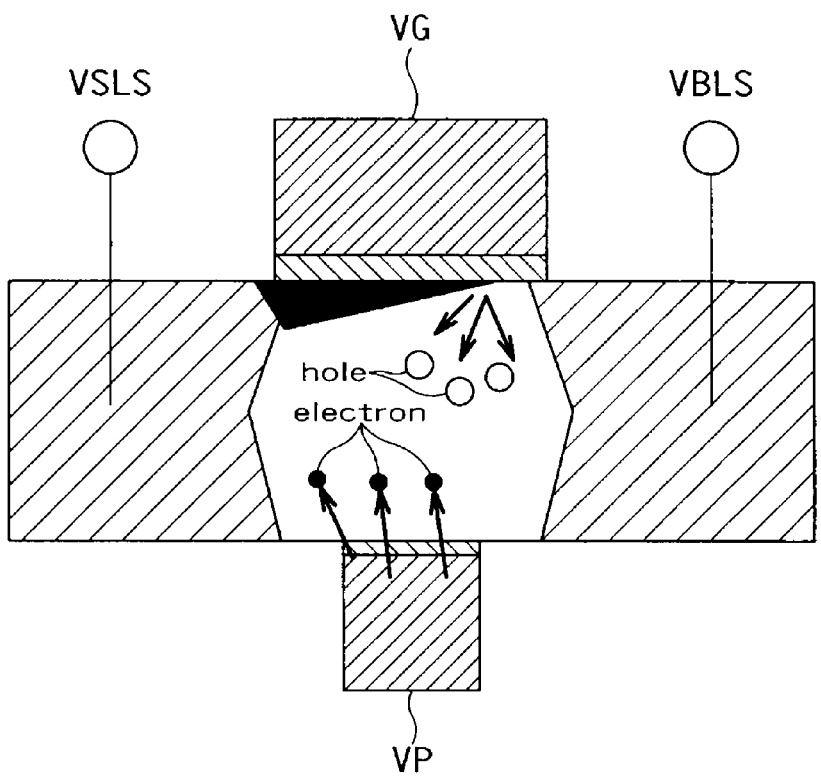
FIG. 3 is a schematic diagram showing the data holding states of the "0" and "1" cells in the SRAM according to the first embodiment.

FIG. 3 is a schematic diagram showing the data holding states of the "0" and "1" cells in the SRAM according to the first embodiment. The potentials of the gate electrode G and the plate electrode P are fixed in the first embodiment. For example, when the potential VBLS of the bit line BL (the drain layer D) is a ground potential (0 V), a potential VG of the gate electrode G is positive (e.g., 0.5 to 0.8 V) and a potential VP (hereinafter, also plate potential VP) of the plate electrode P is negative (e.g., −2.2 V). The potential VSLS of the source line SL (source layer S) is set to be higher than the potential VG. The VSLS is, e.g., 1.2 V. The potential VG of the gate electrode is set so as to be higher than the potential VBLS of the drain layer D and lower than the potential VSLS of the source layer S. An inequality VGD<VDS is satisfied wherein the gate-drain voltage is indicated by VGD and the source-drain voltage is indicated by VDS. Impact ionization occurs between the pinch-off point of a channel on the surface of the body B on the gate electrode G side and the drain layer D. Flow of an impact ionized current from the drain layer D to the body B allows holes to be flown in the body B and accumulated therein.

The potential VP of the plate electrode P is, simultaneously, set to be lower than the potential VSLS of the source layer, potential VBLS of the drain layer, and the potential VG of the gate electrode but larger than them as an absolute value. The plate potential VP is set to be a deep negative potential (e.g., −2.2 V). A gate direct tunnel current (hereinafter, tunnel current) flows from the body B to the plate electrode P. Flow of the tunnel current from the body B to the plate electrode P releases the holes in the body B to the plate electrode P. In other words, flow of the tunnel current from the body B is implantation of electrons from the plate electrode P to the body B.

In the data holding state, the amount of holes flown in the body B by the impact ionized current per unit time is substantially equal to the amount of holes flown (vanished) from the body B by the tunnel current per unit time and they are balanced.

Figure 4:
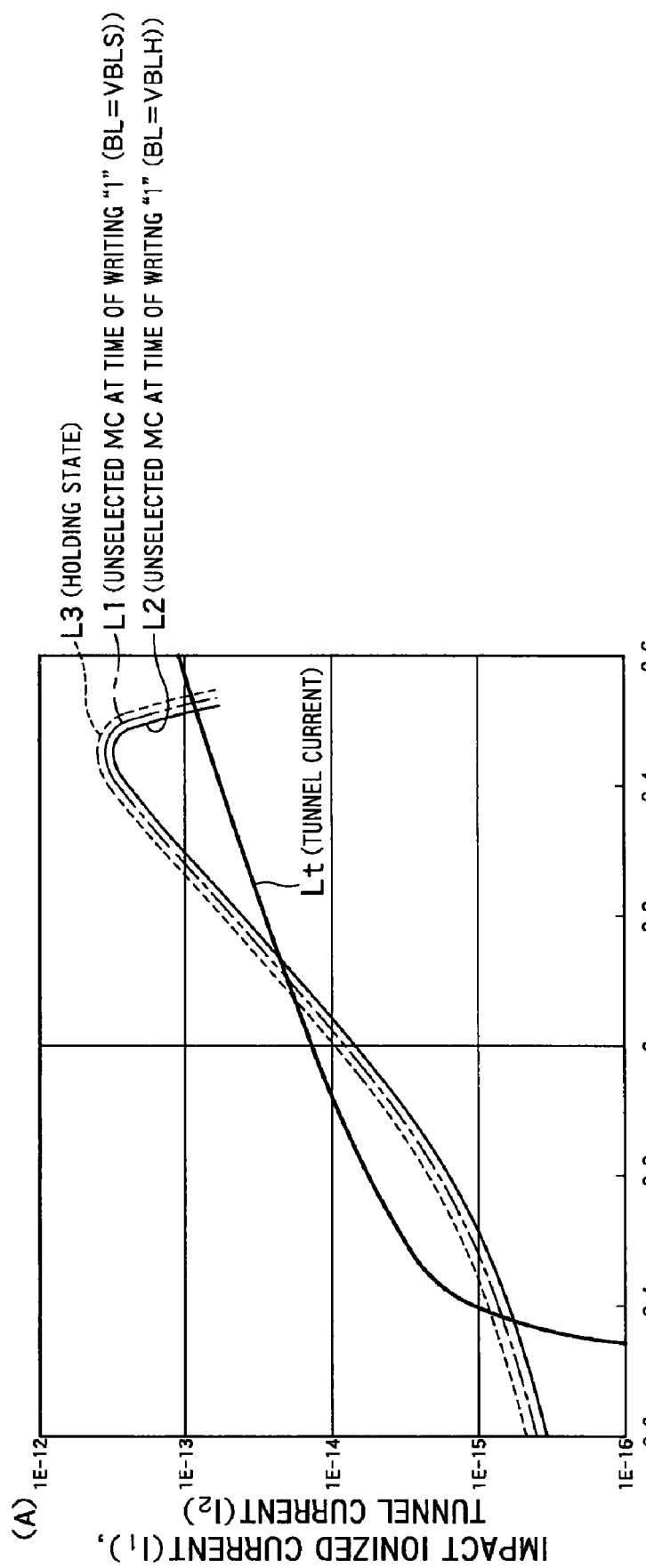
FIG. 4 is a graph showing the relationship between the impact ionized current and the tunnel current.

FIG. 4 is a graph showing the relationship between the impact ionized current and the tunnel current. The horizontal axis indicates a body potential Vbody. With respect to the memory cells MC used for the simulation, the gate dielectric film (SiO$_2$) 40 has a thickness Tox of 2.2 nm, the body B has a thickness TSi of 21 nm, the plate dielectric film (SiO$_2$) 50 has a thickness Tbox of 2.2 nm, and a gate length L is 75 nm.

The gate potential VG is 0 V, the plate potential VP is −2.2 V, the bit line potential VBLS in the data holding state is 1.2 V, and the source line potential VSLS in the data holding state is 0 V.

L1 to L3 are curves indicating the relationship between the impact ionized current and the body potential. Lt is a curve indicating the relationship between the tunnel current and the body potential. L1 to L3 will be described later.

As the body potential Vbody is increased, the tunnel current and impact ionized current are also increased. They cross with each other. For the impact ionized current, as indicated by L1 to L3, as the body potential Vbody is increased, holes are accumulated in the body B, resulting in a decrease in threshold voltage Vt of the memory cell MC. The impact ionized current flowing in the body B is thus further increased. When the body potential Vbody exceeds about 0.5 V, a forward current flows in a body-source pn junction, so that the current is flown from the body B.

When a deep negative potential is applied to the plate electrode P, electrons are supplied to the body B because of the tunneling phenomenon of the plate dielectric film 50. When the body potential Vbody is increased, a potential difference applied to the plate dielectric film 50 is also increased. As indicated by Lt, the tunnel current is thus increased as the body potential Vbody is increased.

Figure 5:
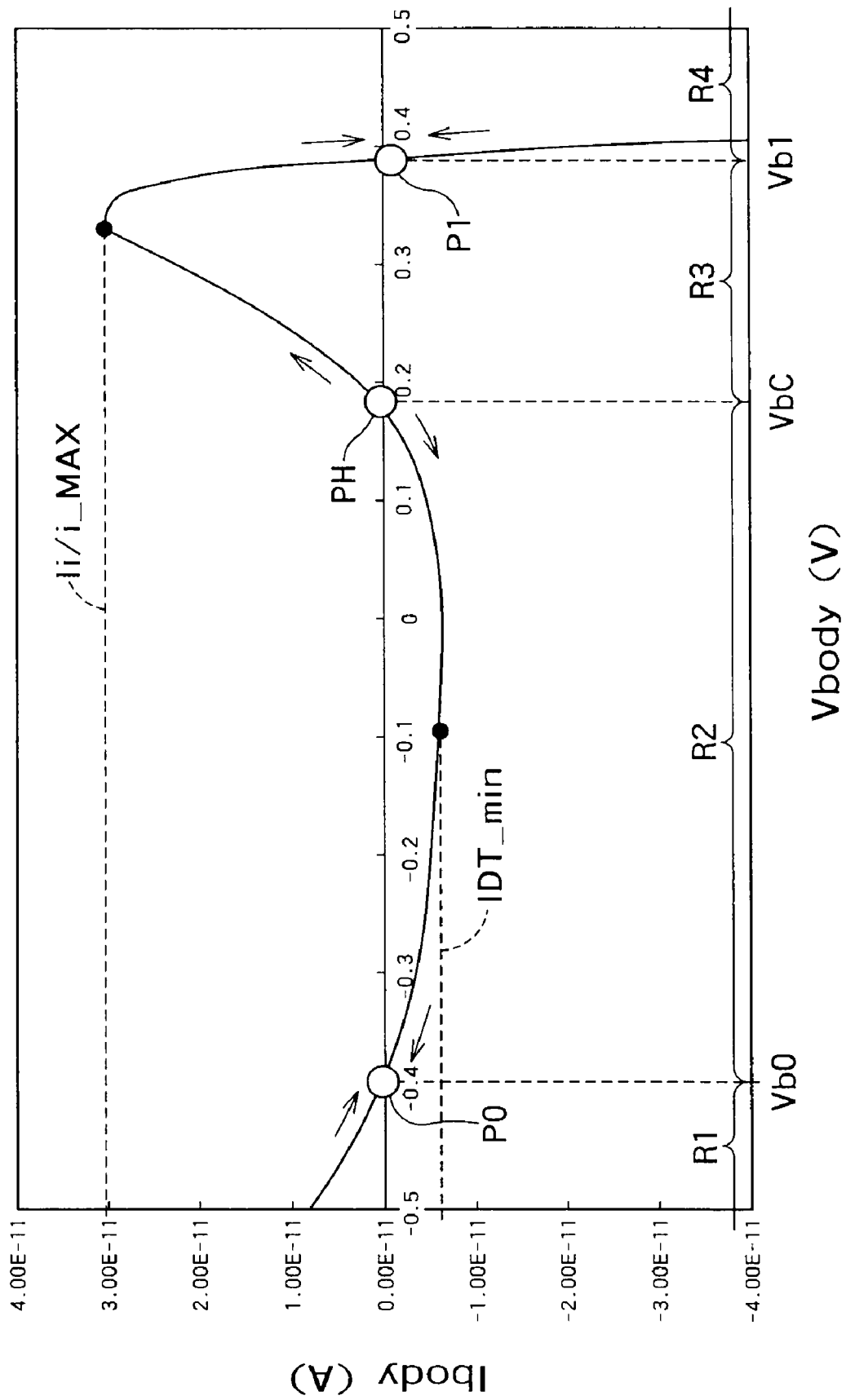
FIG. 5 is a graph showing the difference (Iin−Iout) between the impact ionized current Iin (L3) and the tunnel current Iout (Lt) in the data holding state.

FIG. 5 is a graph showing the difference (Iin−Iout) between the impact ionized current Iin (L3) and the tunnel current Iout (Lt) in the data holding state. A body current Ibody is the difference (Iin−Iout) between a current Iin flowing in the body B and a current Iout flowing from the body B. According to the first embodiment, the body current is indicated by (Iin−Iout). Iin indicates the amount of electric charges flown in the body B per unit time because of the impact ionized current generated between the body B and the drain layer D. Iout indicates the amount of electric charges caused by the tunnel current flown from the plate electrode P through the plate dielectric film 50 to the body B per unit time.

The body current Ibody=(Iin−Iout) changes in the order of positive, negative, positive, and negative as the body potential Vbody is increased from low potential to high potential. The body current Ibody=(Iin−Iout) has two stable stationary points P0 and P1 sandwiching an unstable stationary point PH.

More specifically, assume that a region with a body potential of Vb0 or less is called a first region, a region with a body potential of Vb0 to Vbc a second region, a region with a body potential of Vbc to Vb1 a third region, and a region with a body potential of Vb1 or more a fourth region. The first to fourth regions satisfy the following inequalities 1 to 4.

$$Ibody>0 (Vbody<Vb0) \quad \text{(inequality 1)}$$

$$Ibody<0 (Vb0<Vbody<Vbc) \quad \text{(inequality 2)}$$

$$Ibody>0 (Vbc<Vbody<Vb1) \quad \text{(inequality 3)}$$

$$Ibody<0 (Vb1<Vbody) \quad \text{(inequality 4)}$$

In the first region (inequality 1), the body potential Vbody is increased and the memory cell MC approaches the stationary point P0. In the second region (inequality 2), the body potential Vbody is reduced and the memory cell MC approaches the stationary point P0. In the third region (inequality 3), the body potential Vbody is increased and the memory cell MC approaches the stationary point P1. In the fourth region (inequality 4), the body potential Vbody is reduced and the memory cell MC approaches the stationary point P1. Flow of the body current Ibody allows the memory cell MC to approach the stable stationary points P0 and P1 sandwiching the unstable stationary point PH. Namely, the body current adjusts autonomously the number of the holes in the body B so that the body potential Vbody converges on one of Vb0 and Vb1. The memory cell MC of the first embodiment utilizes such a characteristic to be kept statically in the state of the stable stationary point P0 or P1 during the data is held.

Assume that the body potential of a "0" cell is Vb0 and the body potential of a "1" cell is Vb1. Unless the "0" and "1" cells suffer serious damages exceeding the unstable stationary point PH, the body potentials of the "0" and "1" cells can return to Vb0 and Vb1, respectively simply by flowing the body current even if the body potentials of the "0" and "1" cells shift a little from Vb0 and Vb1. In the data holding state, the data of the "0" and "1" cells keep the "0" and "1" cells at the stationary points P0 and P1 by flowing the impact ionized current and tunnel current. The potential VG of the gate electrode G, the potential VP of the plate electrode P, and the potential VSL of the source line SL need not to be changed for every row. The same potential is used for all rows (all memory cells in the memory cell array). The voltage VBL of the bit line BL needs not to be changed for every column and the same potential is used for all columns (all memory cells in the memory cell array).

The SRAM of the first embodiment holds autonomously the "0" and "1" cells without a refresh operation in the data holding state by making the voltages VG of the gate electrodes G, voltages VP of the plate electrodes P, the potentials VSL of the source lines SL substantially equal for all rows, and voltages of the bit lines BL substantially equal for all columns. According to the SRAM of the first embodiment, the gate electrode G (word line), the plate electrode P (plate line), the source line SL, and the bit line BL need not to be driven in the data holding state.

The body current will be then described. The body current Ibody per unit time is expressed by formula 1.

$$(Iin-Iout)=(Iii+IGIDL+IPN+Idt+ICP)/\tau \quad \text{(formula 1)}$$

(Iin−Iout) is obtained by dividing the current flowing in and from the body B mainly by impact ionization and gate direct tunneling by a period τ. In the formula, Iii indicates a hole current generated by impact ionization (impact ionized current). IGIDL indicates a hole current caused by the GIDL. IPN indicates a current flowing in the body-source or body-drain PN junction. Idt indicates a tunnel current flowing through the plate dielectric film 50. ICP indicates a current (charge pumping current) caused by charge pumping occurred when the voltage of a front word line FWL is reduced. According to this charge pumping, electrons trapped at a surface state on the interface between the body B and the gate dielectric film 40 are recombined with holes in the body, causing the holes to be drawn from the body B. τ indicates a period during which the body current is measured.

In formula 1, + (plus) means that the hole (current) flows in the body B, while − (minus) means that the hole (current) is flown from the body B. The impact ionized current Iii is positive and the tunnel current Idt and charge pumping current ICP are negative. The IGIDL is positive, and the IPN can be positive or negative depending on the potentials of the drain layer D, the body B, and the source layer S. If the body potential Vbody is lower than the source potential and drain potential, IPN is positive. On the other hand, if the body potential Vbody is higher than the source potential and drain potential, IPN is negative. If any other currents flowing in and from the body B exist, they can be put in parentheses on the left-hand side of formula 1. IPN, ICP, and IGIDL can be zero depending on the voltages of electrodes. The impact ionized current Iii and tunnel current Idt should be main components of the body current.

As shown in FIG. 5, the maximum value of the body current Ibody is indicated by Ii/i_max and the minimum value is indicated by IDT_min. At Ii/i_max, the impact ionized current is maximized. The consumption current in the data holding state is proportional to the result of dividing Ii/i_max by an impact ionization rate (Isub/Id). To reduce the consumption current in the data holding state, it is preferable to design so that Ii/i_max is small.

Figure 6:
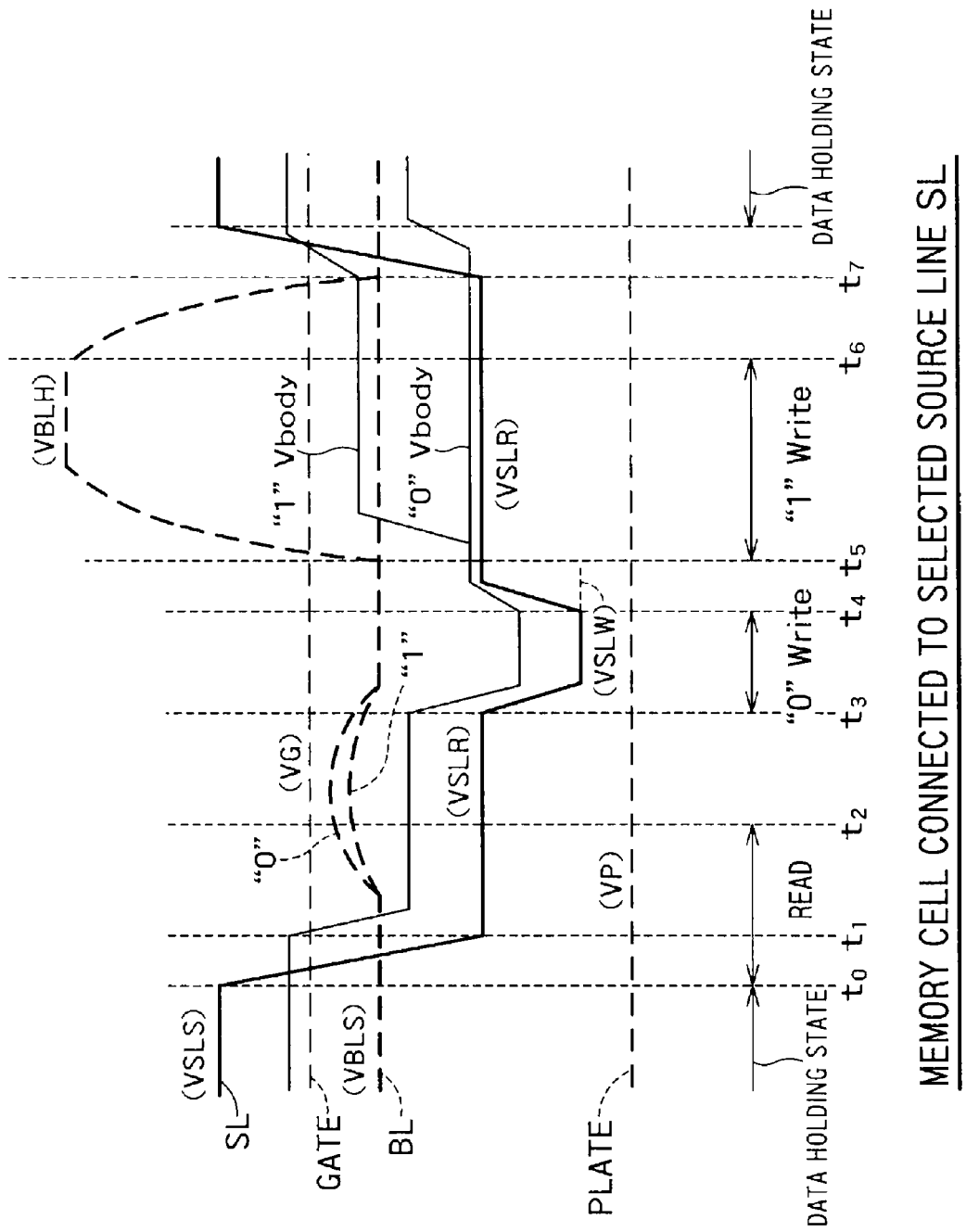
FIGS. 6 and 7 are timing charts showing the operation of SRAM of the first embodiment.
Figure 7:
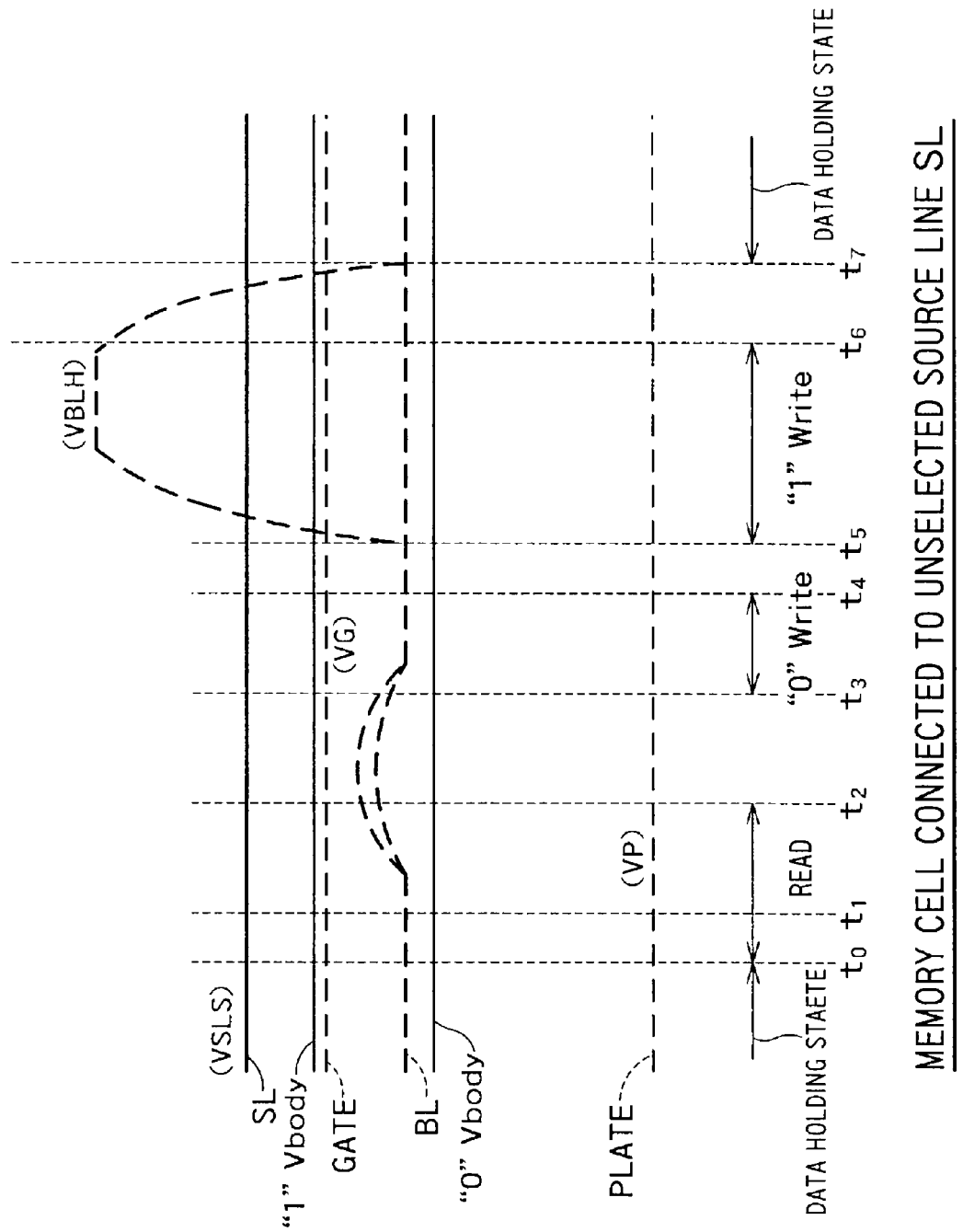

FIGS. 6 and 7 are timing charts showing the operation of SRAM of the first embodiment. FIG. 6 shows the body potential of a memory cell connected to a selected source line and the potentials of electrodes. FIG. 7 shows the body potential of a memory cell connected to an unselected source line and the potentials of electrodes. A device used for this simulation is the same as the one used for the simulation in FIG. 4. With reference to FIGS. 6 and 7, "1" Vbody indicates the body potential of a "1" cell, while "0" Vbody the body potential of a "0" cell.

The potentials of the gate electrode G and the plate electrode P are not driven but fixed to VG and VP, respectively when the data is held, written, and read. The potential of the selected source line SL is driven by the source line driver SLD. According to the first embodiment, drive of a particular source line SL enables the data to be read from or written in the memory cell MC.

In the data holding state, the potentials of all bit lines BL are VBLS (ground potential (0 V)), the potential VG of the gate electrode G a positive potential (e.g., 0.5 to 0.8 V), and the potential VP of the plate electrode P a negative potential (e.g., −2.2 V). The potentials of all source lines SL are a potential VSLS (e.g., 1.2 V) higher than the potential VG. The "0" and "1" cells are kept statically at the stable stationary points P0 and P1 shown in FIG. 5. The potentials of all source lines SL are kept at VSLS in the data holding state.

(External Data Reading Operation)

The potential of the selected source line SLk (0≦k≦n−1) is reduced from VSLS to VSLR (e.g., −0.5 V) at t0 to t1. The source line driver SLD drives the potential of the selected source line SLk from the potential VSLS in the data holding state to the potential VSLR which is close to the plate potential VP. The source line potential VSLR is lower than the gate potential VG and bit line potential VBLS and higher than the plate potential VP. The source potential VSLR is set so that its difference with respect to the gate potential VG is larger than the threshold voltages of the "0" and "1" cells. The memory cells MC connected to the selected source line SLk are thus turned on. When the memory cells MC are on, the potentials of all bit lines BL tend to be reduced to VSLR but are fixed to VBLS at their ends. At t1, a current load circuit (not shown) within the sense amplifier S/A is activated so that a current flows in the memory cell MC. Because the threshold voltage of the memory cell MC varies depending on the amount of holes accumulated in the memory cell MC, the bit line potential varies depending on the data in the memory cell MC. The sense amplifier S/A detects the data using the difference in the bit line potential and then latches the data. The SRAM reads externally the data latched by the sense amplifier S/A corresponding to an externally received address for reading.

During data reading, the difference between the source line potential VSLR and the bit line potential VBLS is made to be smaller than that between the source line potential VSLR and the gate potential VG. This is made in order to suppress impact ionization and prevent the "0" cell from changing to the "1" cell.

After the data is read, the bit line BL is isolated from the sense amplifier S/A at t2. The bit line potential is fixed to VBLS after t3. The source line driver SLD reduces the potential of the selected source line SLk to VSLW (e.g., −1.0 V) much lower than VSLR at t3. The source line driver SLD drives the potential of the selected source line SLk from VSLR to VSLW which is closer to the plate potential VP. A forward bias is applied to the body-source pn junction of the memory cell MC connected to the selected source line SLk. Holes are thus discharged (vanished) from the memory cell MC. The body potential is reduced to a potential higher than VSLW by Fermi level. The data "0" is written in all memory cells MC connected to the selected source line SLk. The "0" writing operation is also called "0" purge.

At t4, the source line driver SLD returns the potential of the selected source line SLk from VSLW to VSLR. At t5, the sense amplifier S/A drives the potential of the bit line BL based on the read data and either implants holes in the body B of the memory cell MC connected to the selected source line SLk or not. More specifically, the sense amplifier S/A raises the potential of a bit line BL connected to the memory cells MC which are originally "1" cells to a high level potential VBLH (e.g., 1.8 V). The potential of a bit line BL for the memory cells MC which are originally "0" cells is held at VBLS. Thus, the data "1" is written back to the memory cell MC which is originally a "1" cell. The memory cell MC which is originally a "0" cell keeps the data provided by the "0" purge.

In the memory cell MC that the data "1" is written, the gate-source voltage VGS is VG-VSLR, while the drain-source voltage VDS VBLH-VSLR. The gate-source voltage VDS is larger than the drain-source voltage VGS. Impact ionization thus occurs, causing holes to be implanted in the body B of the memory cell MC.

The bit line potential of the "1" cell is returned to VBLS at t6. At t7, the source line driver SLD returns the potential of the selected source line SLk from VSLR to VSLS. The SRAM thus returns to the data holding state. Such a data reading cycle allows the data of desired memory cells MC to be read externally to the SRAM.

Meanwhile, the potential of an unselected source line SLi ($0 \leq i \leq n-1$, $i \neq k$) is fixed to VSLS. The potential of the bit line BL is set to VBLS so that the memory cells MC connected to the unselected source line SLi are not turned on. According to the memory cell MC connected to the unselected source line SLi, its gate potential, plate potential and source line potential are the same as those in the data holding state.

The bit line potential is higher than VBLS during the periods that the data is detected and the data "1" is written back. Especially during the period the data "1" is written back, an impact ionized current does not flow in memory cells connected to a bit line BL that the data "1" is written back (memory cells connected to the unselected source line SLi). The impact ionized current flows in memory cells connected to a bit line BL that the data "0" is written back (memory cells connected to the unselected source line SLi) like when the data is held. The impact ionized current flowing in the memory cells connected to the unselected source line SLi varies depending on the data written back to the bit line that the memory cells connect. Such variation in the impact ionized current creates shifts from L3 indicating the impact ionized current when the data is held, like L1 and L2 shown in FIG. 4. L1 indicates an impact ionized current flowing in the memory cells MC connected to a bit line BL with high level potential when the data "1" is written (memory cells connected to the unselected source line SLi). L2 indicates an impact ionized current flowing in the memory cells MC connected to a bit line BL with low level potential when the data "1" is written (memory cells connected to the unselected source line SLi). L3 indicates an impact ionized current flowing in the memory cells MC in the data holding state.

To obtain the stationary points P0 and P1 shown in FIG. 5 even if the impact ionized current shifts from L3 to L1 or L2, the memory cell MC must be such that L3 shown in FIG. 4 is lower than Lt in the second and fourth regions R2 and R4 and L2 is higher than Lt in the first and third regions R1 and R3. Because the potential VP of the plate electrode P is fixed in the first embodiment, the tunnel current Lt does not change.

To reduce shifts of L1 and L2 from L3, the period that the data "1" is written (t5 to t7) is preferably short.

(External Data Writing Operation)

A writing operation is basically the same as the operation shown in FIGS. 6 and 7. After the reading operation at t1 to t2, externally received data for writing is written in a sense amplifier S/A specified by a desired address. The sense amplifier S/A writes the received data for writing in a selected memory cell MC at t3 to t7.

The SRAM of the first embodiment holds, reads, and writes data as described above.

Because the SRAM of the first embodiment utilizes FBCs as the memory cells MC, it is superior in downscaling.

The SRAM of the first embodiment can hold the "0" and "1" cells autonomously by making the voltage VG of the gate electrode G, voltage VP of the plate electrode P, potential VSL of the source line SL substantially equal for all rows, and voltage of the bit line BL substantially equal for all columns utilizing the relationship between the impact ionized current and tunnel current shown in FIG. 5. Because the SRAM of the first embodiment does not require a refresh operation in the data holding state, the gate electrode G (word line), the plate electrode P (plate line), source line SL, and bit line BL need not to be driven. Its refresh busy rate is zero and the consumption power while the data is held is less.

According to the SRAM of the first embodiment, because the gate potential and plate potential are fixed and the source line potential is driven, a gate electrode driver (word line driver) and plate electrode driver (plate line driver) are not required. The SRAM of the first embodiment is more superior in downscaling.

Second Embodiment

Figure 8:
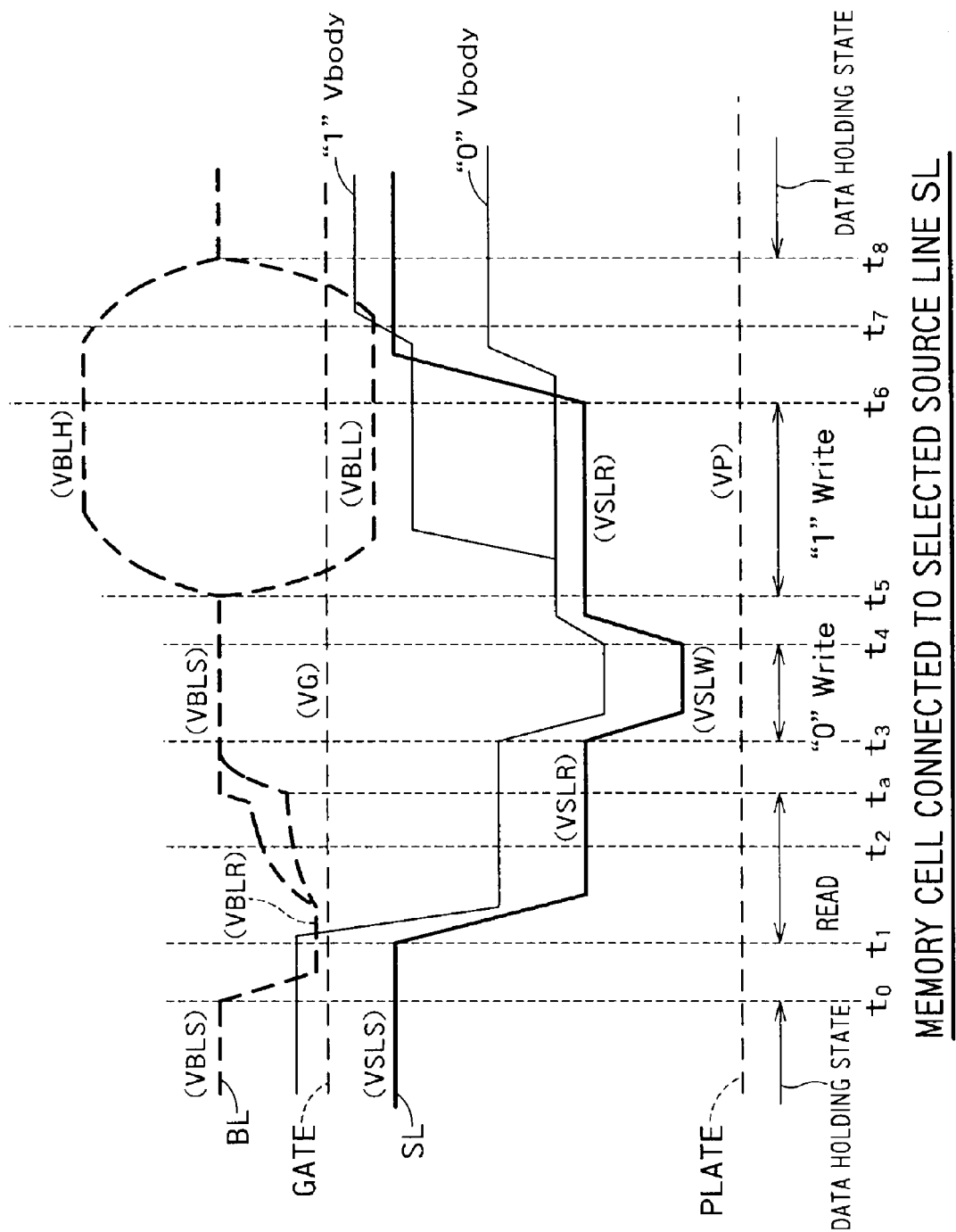
FIGS. 8 and 9 are timing charts showing the operation of an SRAM according to a second embodiment of the present invention.
Figure 9:
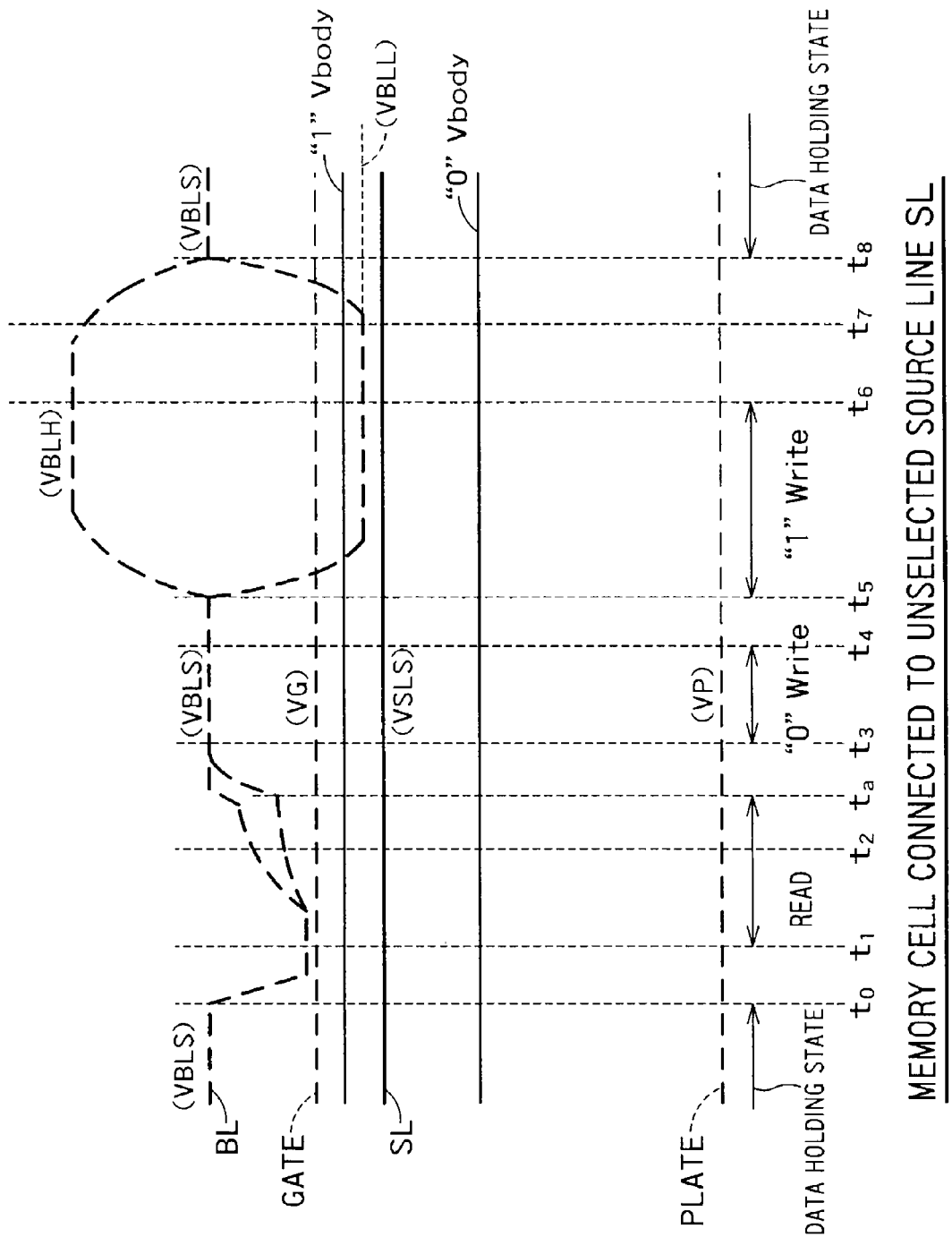

FIGS. 8 and 9 are timing charts showing the operation of an SRAM according to a second embodiment of the present invention. The configuration of the second embodiment is the same as that of the first embodiment. FIG. 8 shows the body potential of a selected memory cell and the potentials of electrodes. FIG. 9 shows the body potential of an unselected memory cell and the potentials of electrodes. A device used for the simulation is the same as the one used for the simulation shown in FIG. 4.

The second embodiment is the same as the first embodiment in that the gate potential and plate potential are fixed to VG and VP, respectively. The second embodiment is different from the first embodiment in that the magnitude relation between the bit line potential and source line potential in the data holding state is opposite. For example, the potentials VSLS of all source lines SL are a ground potential (0 V) in the data holding state. The potentials of all bit lines BL are a potential VBLS higher than the potential VG (e.g., 1.2 V). The stationary points P0 and P1 shown in FIG. 5 can be obtained even if the potential relationship between the bit line BL and source line SL in the data holding state is opposite. As a result, the SRAM of the second embodiment does not require the refresh operation in the data holding state like the SRAM of the first embodiment and can hold the "0" and "1" cells autonomously.

The reading and writing operations of the SRAM according to the second embodiment are performed as described below.

(External Data Reading Operation)

The potentials of all bit lines BL are reduced from VBLS to VBLR (e.g., 0.7 V) at t0. The potentials of all bit lines BL are made to be close to the source potential VSLS and the gate potential VG. The difference between the source line potential VSLR and bit line potential VBLR is made to be smaller than the difference between the source line potential VSLS and bit line potential VBLS in the data holding state. This is to reduce the source-drain potential difference VDS of a memory cell to be read so as to suppress impact ionization and to prevent the "0" cell from changing to the "1" cell.

At t1 to ta, the potential of the selected source line SLk is reduced from VSLS to VSLR (e.g., −1 V). The source line driver SLD drives the potential of the selected source line SLk from the potential VSLS in the data holding state to the potential VSLR that is close to the plate potential VP. The source potential VSLR is lower than the gate potential VG and bit line potential VBLS and higher than the plate potential VP. The source potential VSLR is set so that its difference with respect to the gate potential VG is larger than the threshold voltages of the "0" and "1" cells. Memory cells MC connected to the selected source line SLk are thus turned on. The sense amplifier S/A detects the data of the memory cells MC connected to the selected source line SLk and then latches the data. The SRAM reads externally the data latched by the sense amplifier S/A corresponding to an externally received address for reading.

After the data is read, the bit line BL is isolated from the sense amplifier S/A at ta. The bit line potential is fixed to VBLS at and after t3. At t3, the source line driver SLD reduces the selected source line SLk to VSLW (e.g., −1.6 V) much lower than VSLR. The source line driver SLD drives the potential of the selected source line SLk from the potential VSLR to the potential VSLW that is closer to the plate potential VP. A forward bias is thus applied to the body-source pn junction of the memory cell MC connected to the selected source line SLk. Holes are thus discharged (vanished) from that memory cell MC. The body potential is reduced to a potential higher than the potential VSLW by Fermi level. All memory cells MC connected to the selected source line SLk are subjected to "0" purge.

The source line driver SLD returns the potential of the selected source line SLk from VSLW to VSLR at t4. At t5, the sense amplifier S/A drives the potential of the bit line BL based on the read data and either implants holes in the body B of the memory cell MC connected to the selected source line SLk or not. More specifically, the sense amplifier S/A raises the potential of a bit line BL connected to the memory cells MC which are originally "1" cells to a high level potential VBLH (e.g., 2 V). The sense amplifier S/A also reduces the potential of a bit line BL for the memory cells MC which are originally "0" cells to VBLL (e.g., 0 V). The data "1" is written back in the memory cells MC, which are originally "1" cells. The memory cells MC which are originally "0" cells keep the data provided by the "0" purge.

In the memory cells MC that the data "1" is written, the gate-source voltage VGS is (VG-VSLR), while the drain-source voltage VDS (VBLH-VSLR). The gate-source voltage VDS is larger than the drain-source voltage VGS. Impact ionization thus occurs, causing holes to be implanted in the body B of the memory cell MC.

The source line driver SLD returns the potential of the selected source line SLk to VSLS at t6. At t7 to t8, the sense amplifier S/A returns the potential of the bit line BL to VBLS. The SRAM returns to the data holding state. Such a data reading cycle allows the data of desired memory cells MC to be read externally to the SRAM.

On the other hand, the potential of the unselected source line SLi is fixed to VSLS. In the memory cells MC connected to the unselected source line SLi, the gate potential, plate potential, and source line potential are the same as those in the data holding state.

The bit line potential is higher or lower than VBLS during the periods the data is detected and the data "1" is written back. An impact ionized current can be different from the one in the data holding state (L3 shown in FIG. 4). Even in such a case, the memory cell MC is designed so as to obtain the stationary points P0 and P1 shown in FIG. 5 as in the first embodiment.

The period the data "1" is written (t5 to t8) is preferably short so that the impact ionized current does not shift largely from L3.

(External Data Writing Operation)

A writing operation is basically the same as the one shown in FIGS. 8 and 9. After the reading operation at t1 to ta, externally received data for writing is written in a sense amplifier S/A specified by a desired address. The sense amplifier S/A writes the received data for writing in a selected memory cell MC at t3 to t8.

The SRAM of the second embodiment holds, reads, and writes the data as described above. In the second embodiment, the same effects as those in the first embodiment can be obtained.

Third Embodiment

According to a third embodiment of the present invention, the potentials of electrodes in a standby data holding state are different from those of an active data holding state.

Figure 10:
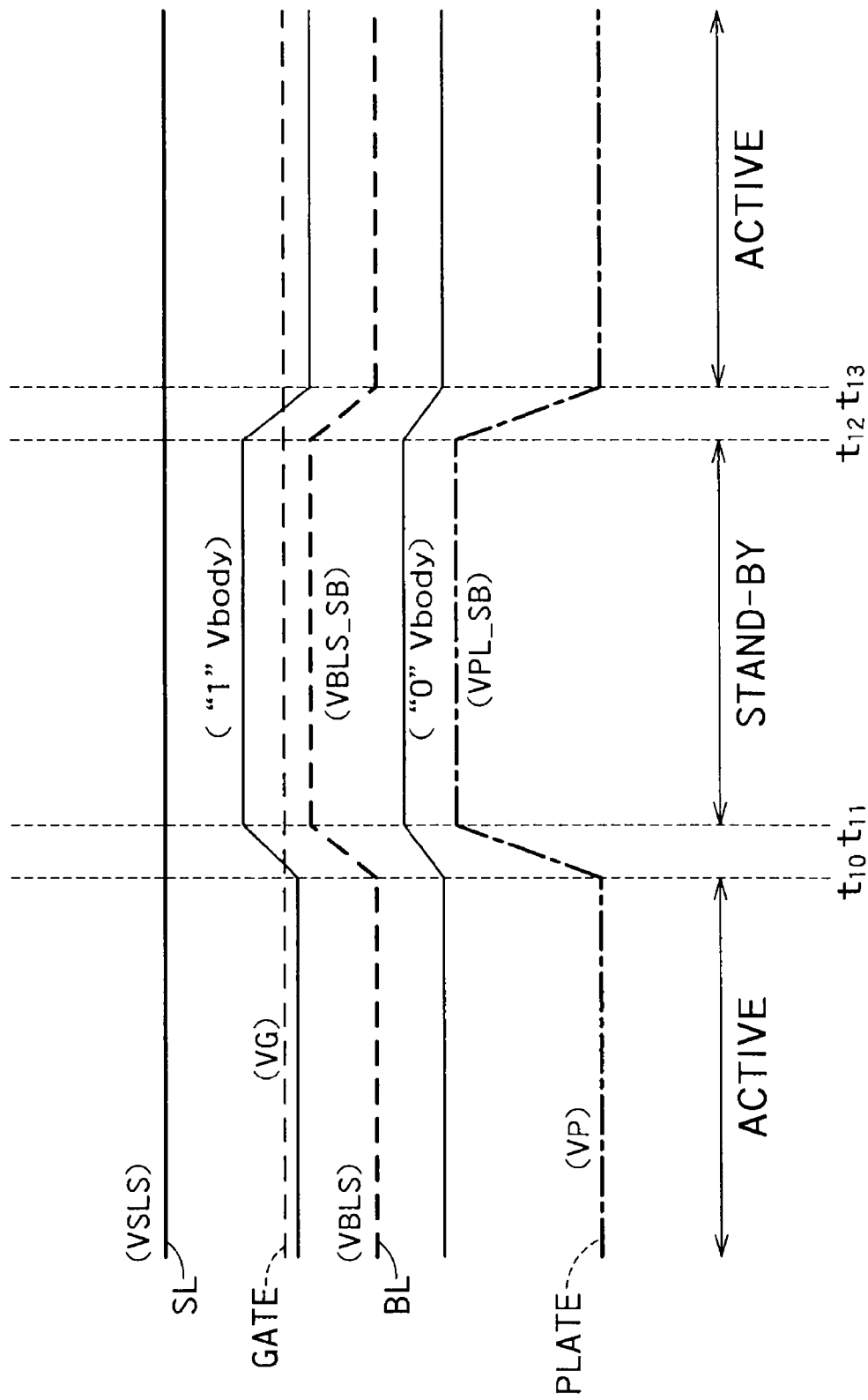
FIGS. 10 to 12 are timing charts showing the standby data holding state and active data holding state of an SRAM according to the third embodiment.
Figure 11:
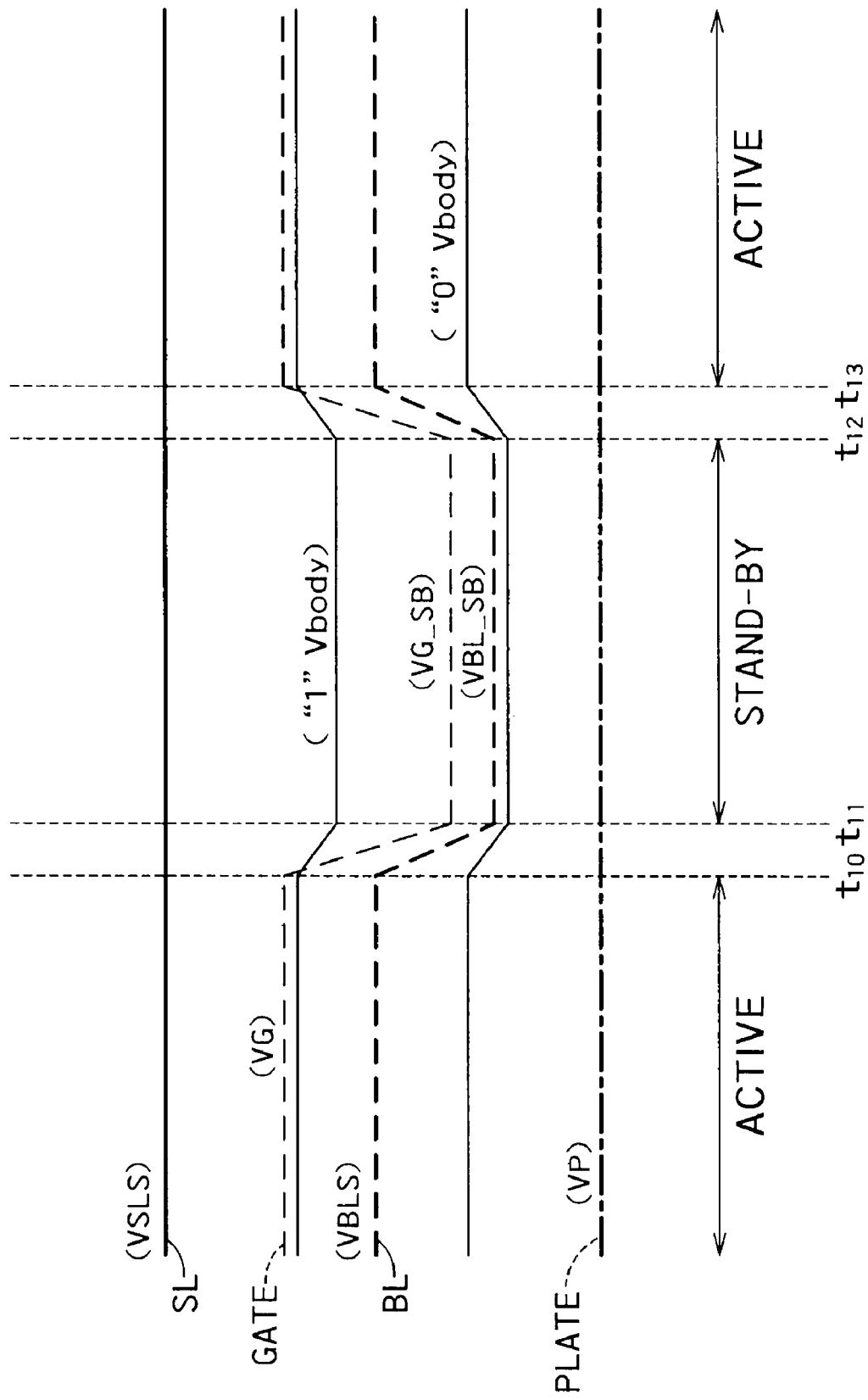
Figure 12:
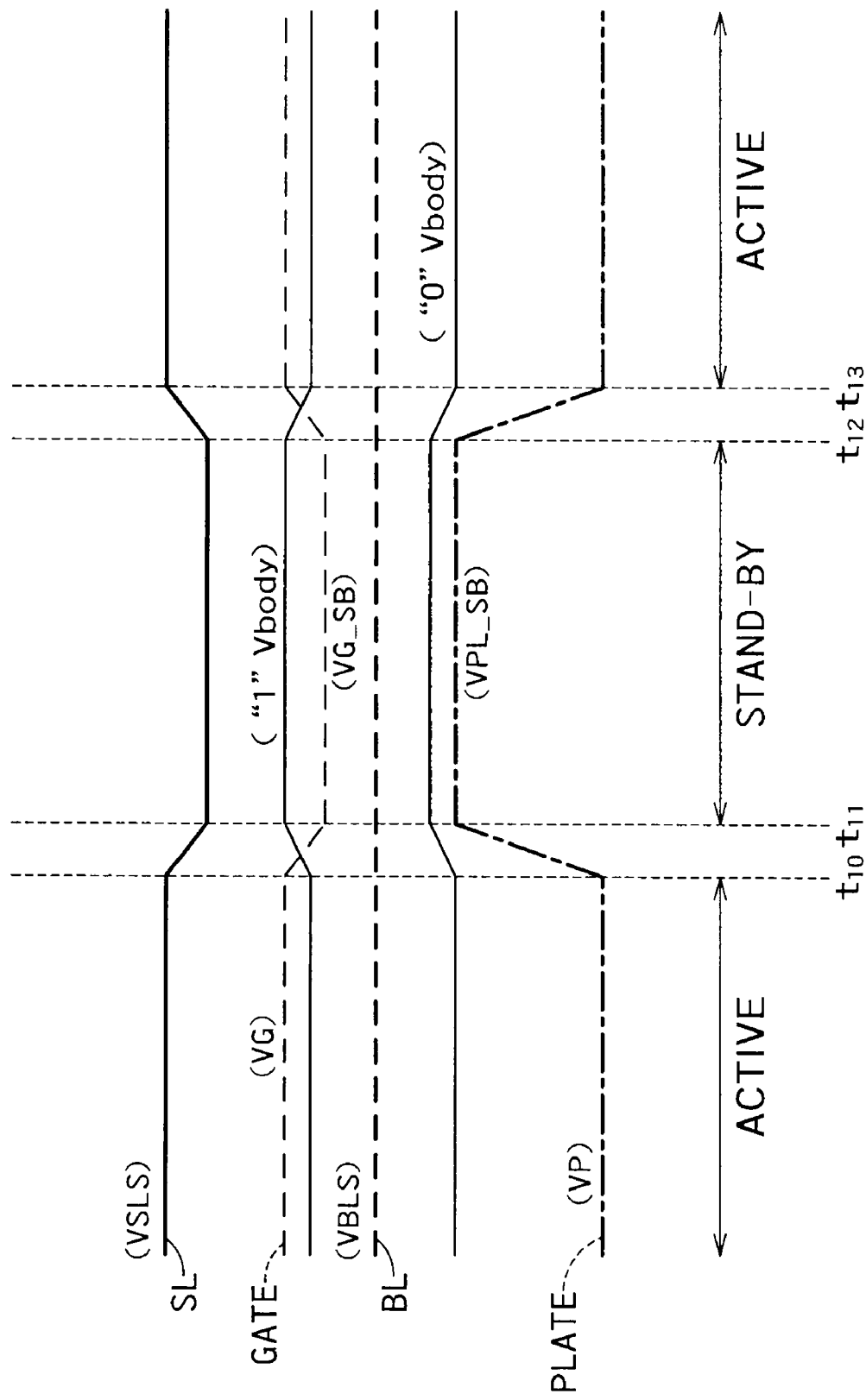

FIGS. 10 to 12 are timing charts showing the standby data holding state and active data holding state of an SRAM according to the third embodiment. In FIGS. 10 to 12, the active data holding state is the same as the data holding state in FIGS. 6 and 7. The active state refers to as a state that there exist external accesses for data reading or writing and the interval from an access to the next access is shorter than a predetermined interval. The standby state refers to as a state that a predetermined period or longer has elapsed from the last access.

With reference to FIG. 10, the bit line potential is increased from VBLS to VBLS_SB at the time of standby (t11 to t13). The bit line potential which is closer to the plate potential than the source line potential is made to approach the gate potential. The potential difference between the gate and drain in the data holding state during standby is smaller than that during activation. An impact ionized current is thus reduced. The plate potential is increased from VP to VP_SB. The potential difference between the gate and plate in the data holding state during standby is smaller than that during activation. The potential difference between the body and plate is reduced, resulting in a decrease in the tunnel current.

To hold data during accesses, Ii/i_max shown in FIG. 5 must be sufficiently large in the periods t1 to t5 during which the impact ionized current is effective (I/I effective period) other than the period during which the impact ionized current is not effective (t5 to t7) shown in FIG. 7. Further, IDT_min shown in FIG. 5 must be sufficiently small in all periods t1 to t7. This is because the bit line is driven in the memory cells connected to the unselected source line SLi as shown in FIG. 7. To increase the absolute values of Ii/i_max and IDT_min sufficiently, the absolute values of VG, VBLS, and VP must be increased with respect to VSLS.

However, it is sufficient that the memory cell MC can merely hold the data during standby. The impact ionized current should be sufficiently larger than a body-source pn junction leak current for a "1" cell. At the time of standby, the absolute values of Ii/i_max and IDT_min can be smaller than those during activation. The impact ionized current and tunnel current at the time of standby are reduced, causing the consumption current to be further reduced.

With reference to FIG. 11, the bit line potential is reduced from VBLS to VBLS_SB during standby (t11 to t13). With this, the gate potential is also reduced from VG to VG_SB. The reduction of the gate potential is larger than that of the bit line potential. In other words, the bit line potential which is closer to the plate potential than the source line potential is made to approach the gate potential. The potential difference between the gate and drain in the data holding state during standby is smaller than that during activation. The impact ionized current is thus reduced. The potential difference between the gate and plate in the data holding state during standby is smaller than that during activation. The body-plate potential difference is reduced, resulting in a decrease in the tunnel current.

In the operation of FIG. 11, the body potential is reduced because of a gate-body capacitive coupling. A pn junction leak current between the body and source of a "1" cell is thus reduced, resulting in a further effective reduction in consumption current as compared to the operation of FIG. 10.

With reference to FIG. 12, the bit line potential is fixed to VBLS during standby (t11 to t13). The gate potential, plate potential, and source potential are made to be close to the bit line potential. Even with such an operation, the gate-drain potential difference in the data holding state during standby is smaller than that during activation. The impact ionized current is thus reduced. The gate-plate potential difference in the data holding state during standby is smaller than that during activation. The body-plate potential difference is thus reduced, resulting in a decrease in the tunnel current. The operation of FIG. 12 can obtain the same effects as in the operation of FIG. 10.

Either one of the gate potential or the plate potential are changed in FIGS. 10 and 12. To perform such changes, switches (not shown) for switching between a high level power supply and a low level power supply are provided. Therefore, the word line driver and plate line driver are not required because the gate potential and plate potential are common to all memory cells MC.

Other configurations and operations of the third embodiment are similar to those of the first embodiment. Thus, in the third embodiment, the same effects as those in the first embodiment can be obtained.

The bit line potential and source line potential are interchangeable in the third embodiment. In this case, the third embodiment can be applied to the second embodiment. Thus, in the third embodiment, the same effects as those in the second embodiment can be obtained.

Fourth Embodiment

Figure 13:
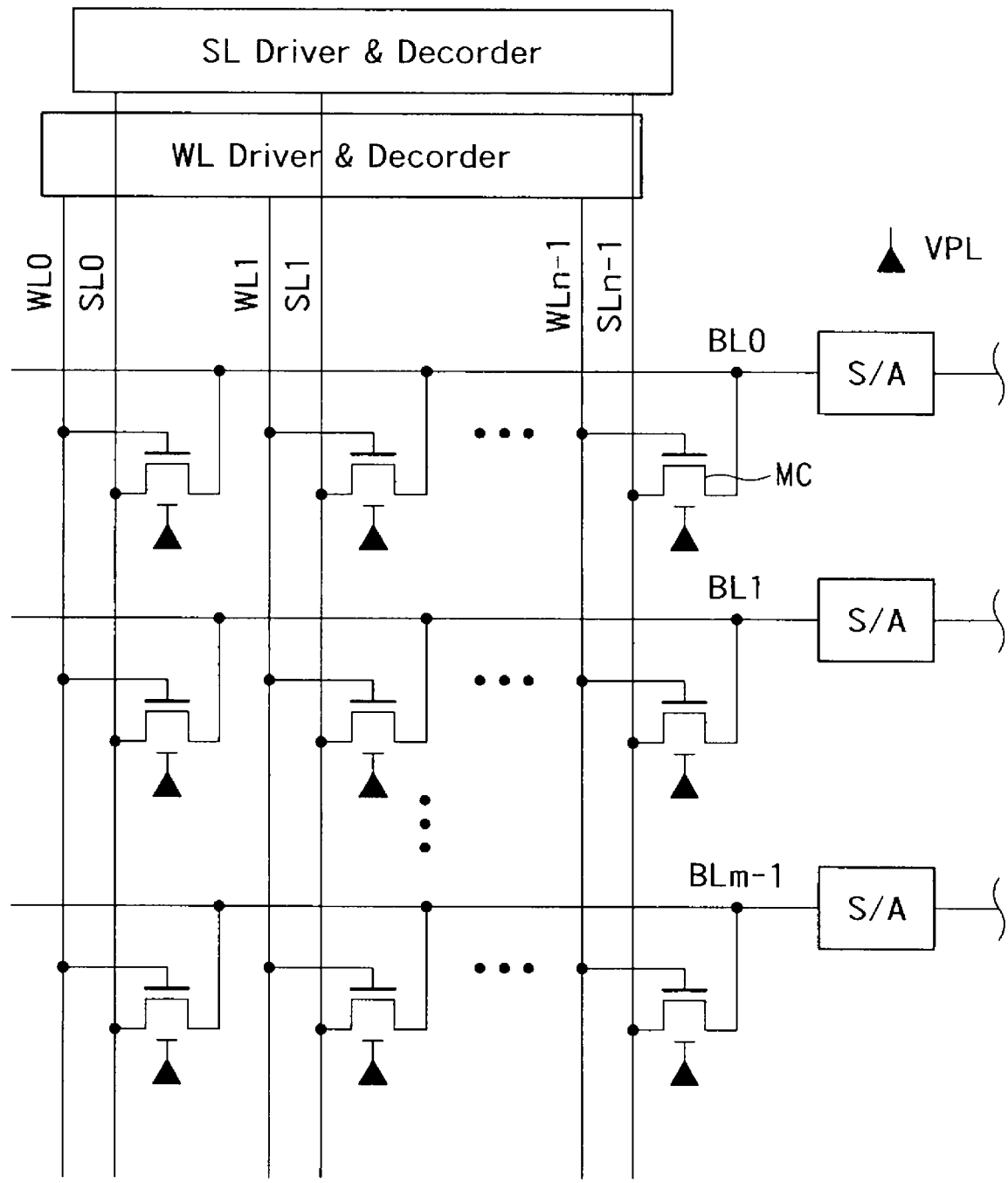
FIG. 13 is a circuit diagram showing an example of an SRAM according to a fourth embodiment of the present invention.

FIG. 13 is a circuit diagram showing an example of an SRAM according to a fourth embodiment of the present invention. In the fourth embodiment, word lines WL corresponding to the source lines SL, a word line driver for driving the word lines WL and word line decoder WLD are provided. Other configurations of the fourth embodiment can be similar to those of the first embodiment.

The gate of a memory cell MC connected to a source line SL is connected to the word line WL corresponding to that source line SL. The gate of the memory cell MC connected to the source line SL functions as the word line WL corresponding to that source line SL.

Figure 14:
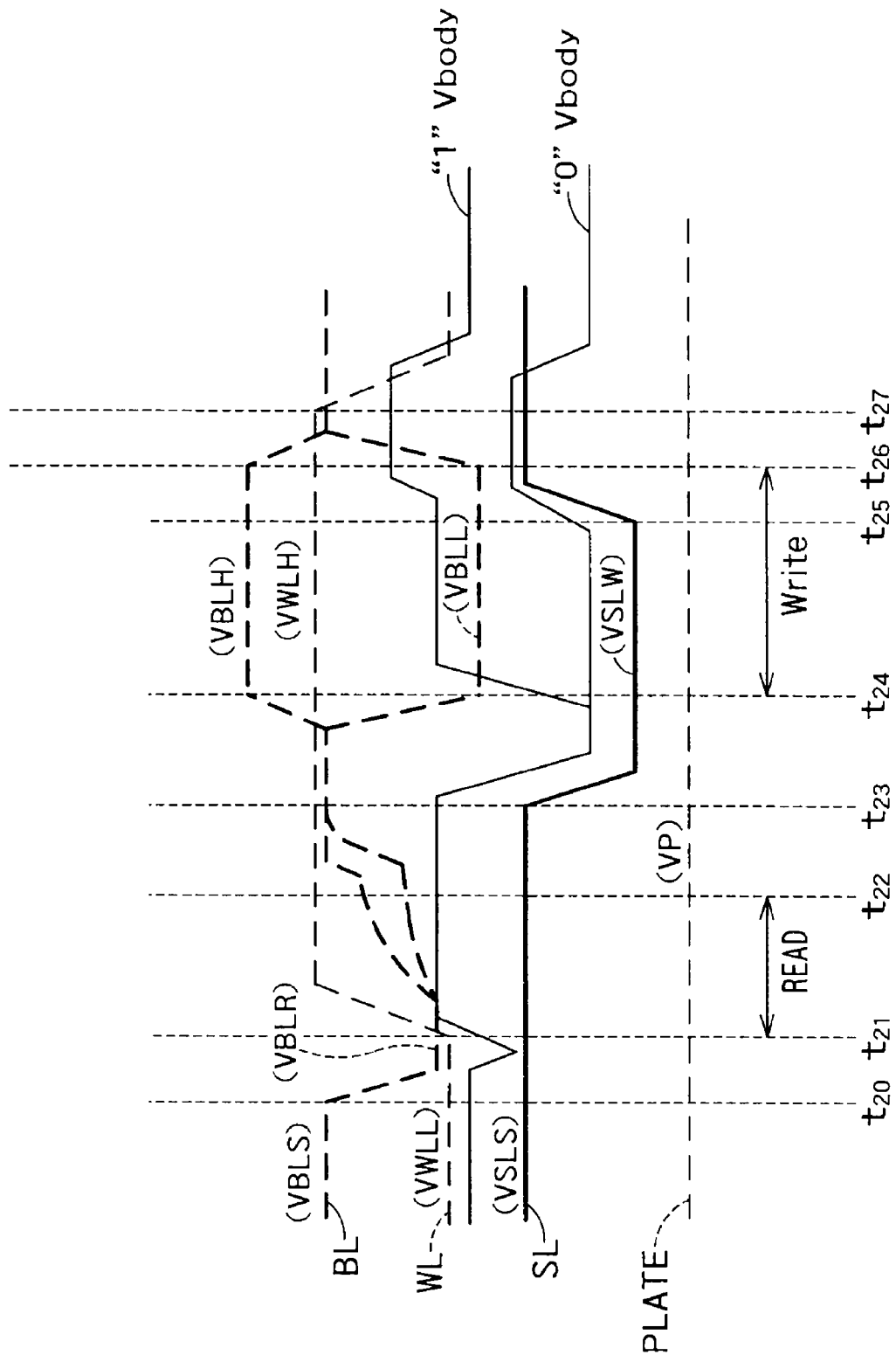
FIGS. 14 and 15 are timing charts showing the operation of the SRAM according to the fourth embodiment.
Figure 15:
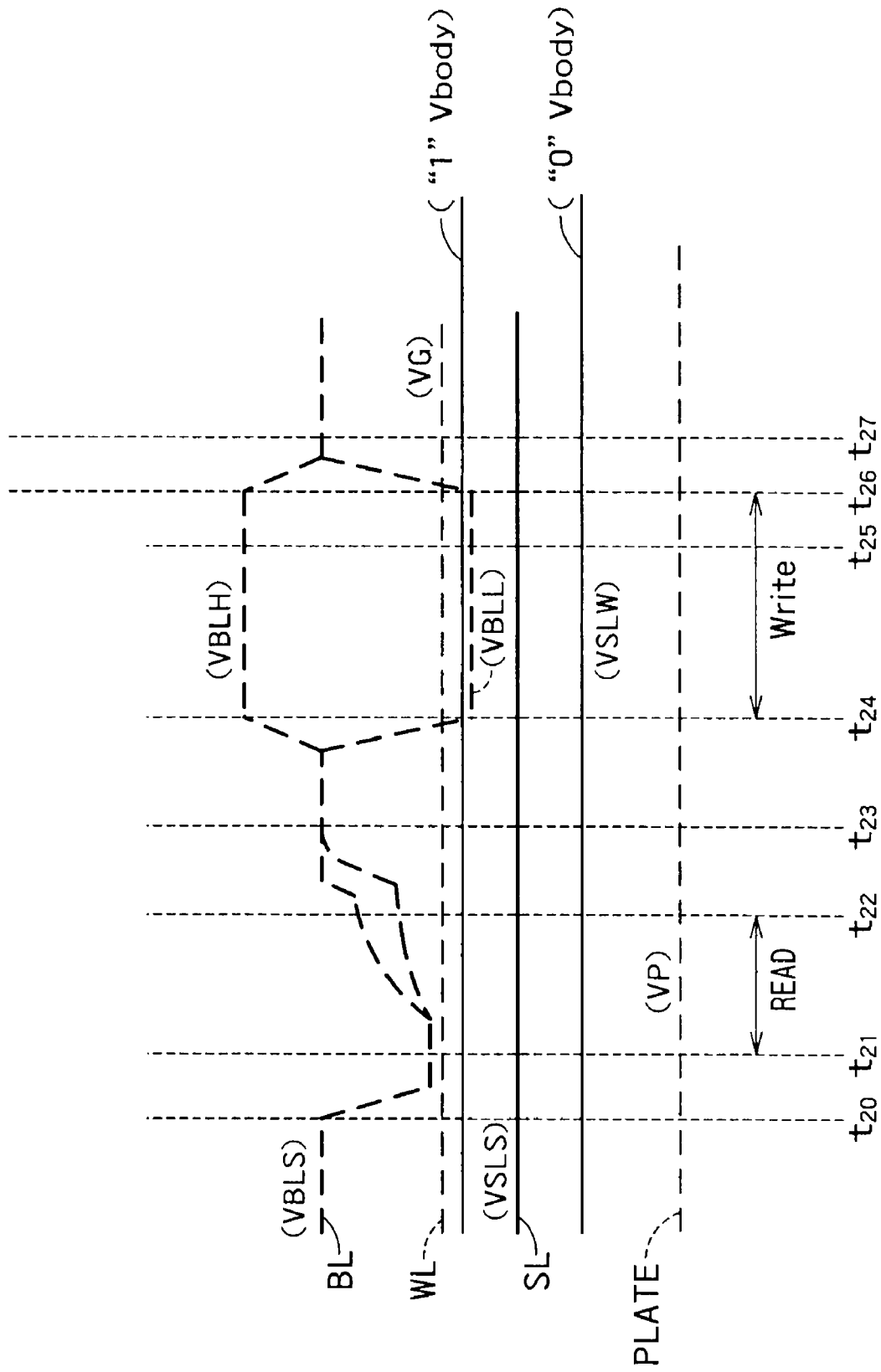

FIGS. 14 and 15 are timing charts showing the operation of the SRAM according to the fourth embodiment. FIG. 14 shows the body potential of a memory cell connected to a selected word line and selected source line and the potentials of electrodes. FIG. 15 shows the body potential of a memory cell connected to an unselected word line and unselected source line and the potentials of electrodes. A device used for the simulation is the same as the one used for the simulation in FIG. 4. In these drawings, "1" Vbody indicates the body potential of a "1" cell, while "0" Vbody the body potential of a "0" cell.

In the first and second embodiments, the source line driver SLD reduces the source line potential at t1. According to the fourth embodiment, the source line potential is not reduced. Instead, the word line driver WLD increases the word line potential from VWLL to VWLH. Thus, the source line driver SLD does not change the source line potential from VSLS at t21 in the fourth embodiment.

The source line driver SLD then reduces the source line potential from VSLS (e.g., 0 V) to VSLW (e.g., −0.6 V) at t23. The sense amplifier S/A raises the potential of a bit line BL for the "1" cell to VBLH and reduces the potential of a bit line BL for the "0" cell to VBLL at t24. The data "1" and "0" are written back simultaneously in the "1" and "0" cells, respectively. The fourth embodiment does not require the "0" purge.

The source line driver SLD returns the source line potential to VSLS at t25. The sense amplifier S/A returns the bit line potential to VBLS at t26. The word line driver WLD returns the word line potential to VWLL. Other operations of the fourth embodiment can be similar to those of the first embodiment.

As described above, in the fourth embodiment, when the data is read by the sense amplifier S/A, not the source line potential but the word line potential is changed. When the data is then written in the memory cells MC, not the word line potential but the source line potential is changed. By driving the source line potential and word line potential individually, variations in potentials for the source line SL and word line WL are made small. Because the data "0" and "1" are written simultaneously in the fourth embodiment, one cycle can be shortened. Further, in the fourth embodiment, the same effects as those in the first embodiment can be obtained.

Fifth Embodiment

Figure 16:
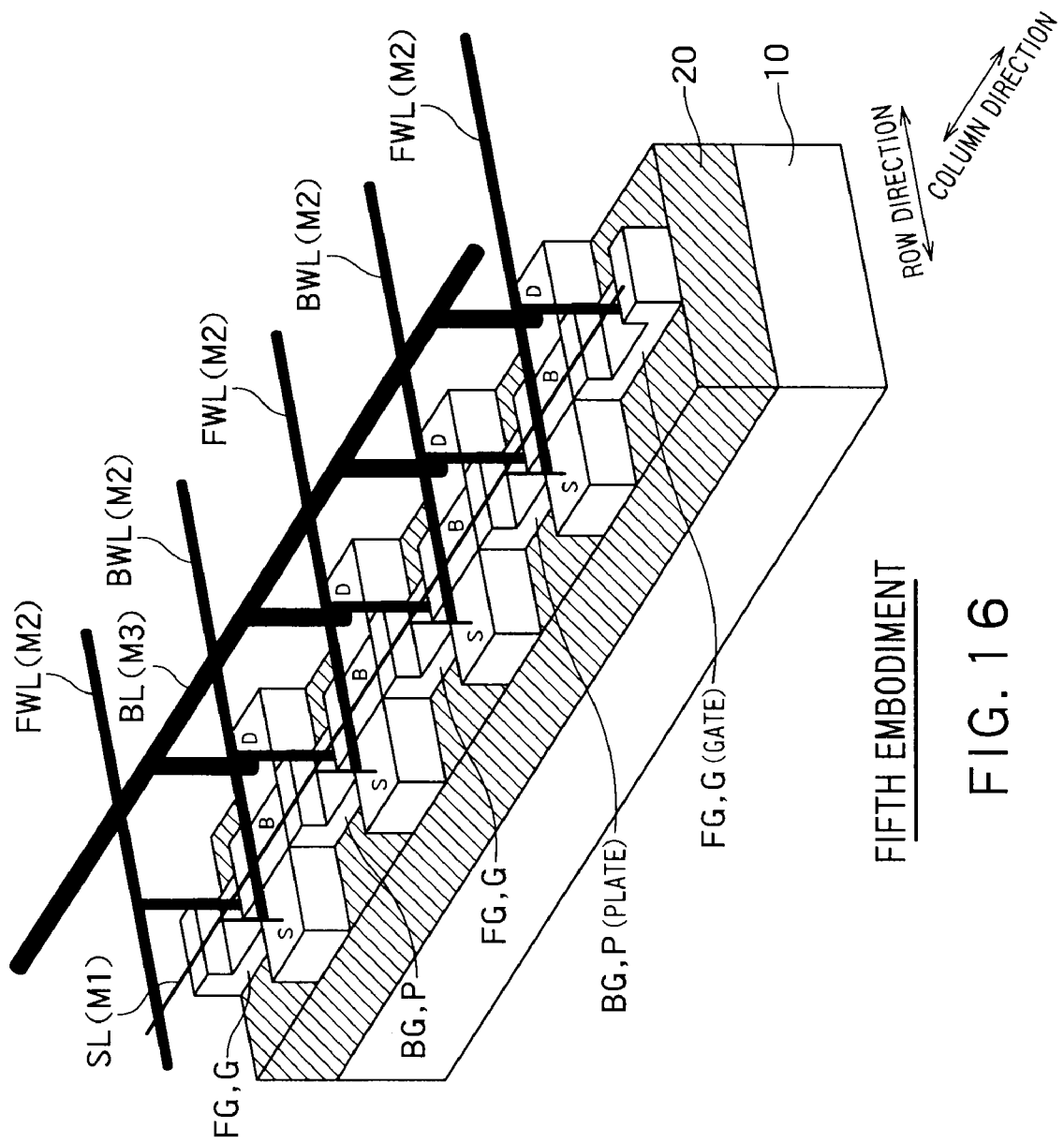
FIGS. 16 and 17 are perspective views showing the configurations of an SRAM according to a fifth embodiment of the present invention.
Figure 17:
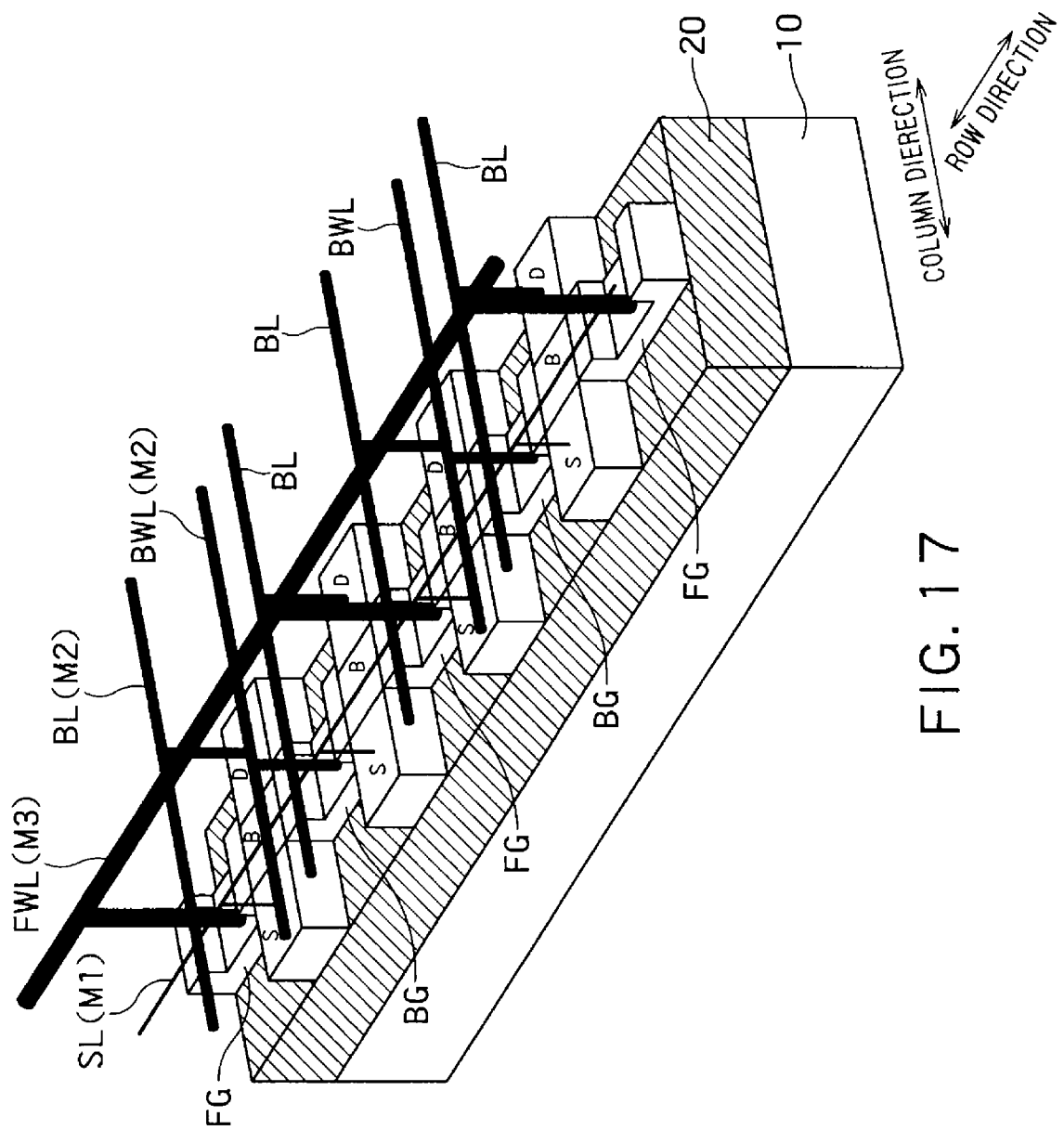

FIGS. 16 and 17 are perspective views showing the configurations of an SRAM according to a fifth embodiment of the present invention. Fin-FETs are used as the memory cells MC in the fifth embodiment. In the first and second embodiments, the memory cell MC is a flat FET. Its gate electrode G opposes a top surface of the body B, while the plate electrode P the bottom surface. On the other hand, the gate electrode G (also called front gate FG) and the plate electrode P (also called back gate BG) face a side surface of the body B in the fifth embodiment. A gate dielectric film and plate dielectric film (not shown in FIGS. 16 and 17) are provided between the front gate FG and the body B and between the back gate BG and body B, respectively.

According to the SRAM of FIG. 16, source lines SL and bit lines BL extend in the same direction (column direction). Front word lines FWL and back word lines BWL extend in a row direction which is perpendicular to the column direction. The front word line FWL is connected to the front gate FG of a memory cell MC arranged in the row direction. The back word line BWL is connected to the back gate BG of a memory cell MC arranged in the row direction. The source line SL is formed of a first metal layer (bottom metal layer) M1. The front word line FWL and back word line BWL are formed of a second metal layer (intermediate metal layer) M2. The bit line BL is formed of a third metal layer (top metal layer) M3. The source line SL, front word line FWL, back word line BWL, and bit line BL are made of metals, e.g., copper, aluminum, and tungsten.

According to the SRAM of FIG. 17, the source lines SL and front word lines FWL extend in the same direction (row direction). The bit lines BL and back word lines BWL extend in a column direction which is perpendicular to the row direction. The front word line FWL is connected to the front gate FG of a memory cell MC arranged in the row direction. The back word line BWL is connected to the back gate BG of a memory cell MC arranged in the column direction. The source line SL is formed of the first metal layer (bottom metal layer) M1. The bit line BL and back word line BWL are formed of the second metal layer (intermediate metal layer) M2. The front word line FWL is formed of the third metal layer (top metal layer) M3.

Other configurations and operations of the fifth embodiment can be similar to those of any of the first to fourth embodiments. The autonomous refresh operation is performed for the FBC memory using Fin-FETs as the memory cells MC. Therefore, in the fifth embodiment, the same effects as those in any of the first to fourth embodiments can be obtained.

In such a Fin FBC, it is preferable that the thickness of the second gate dielectric film 50 is substantially the same as that of the first gate dielectric film 40. This is because the first and second gate dielectric films 40 and 50 can be formed simultaneously and the FBC memory is advantageously easily fabricated.

The bit line potential, source line potential, and word line potential are actually subjected to voltage drops by contact resistances and then transmitted to the drain layer D, the source layer S, and the gate electrode G. In the above embodiments, however, the bit line potential, the source line potential, and the word line potential are the same as the potentials of the drain layer D, the source layer S, and the gate electrode G, respectively for the sake of convenience.

While an N-type FET is used as the memory cell MC in the above embodiments, a p-type FET can be also used for the memory cell MC. In the case of using a p-type FET, it suffices that the plus and minus of the electrodes' voltages are reversed. The signs in the graph of FIG. 5 are also reversed in this case, and the body current (Iin−Iout) thus changes in the order of negative, positive, negative, and positive.

The invention claimed is:

1. A semiconductor memory device comprising:
   a semiconductor layer;
   a source layer and a drain layer within the semiconductor layer;
   an electrically floating body region provided between the source layer and the drain layer in the semiconductor layer and accumulating or releasing electric charges to store logical data;
   a first gate dielectric film provided on a first surface of the body region;
   a first gate electrode provided on the first surface via the first gate dielectric film;
   a second gate dielectric film provided on a second surface of the body region different from the first surface;
   a second gate electrode provided on the second surface via the second gate dielectric film;
   a driver applying a potential to the source layer; and
   a sense amplifier reading or writing the logical data from or in a memory cell including the source layer, drain layer, and body region, wherein
   in a data holding state, a potential of the first gate electrode is set to be higher than one of potentials of the source layer and the drain layer and lower than the other of the potentials of the source layer and the drain layer so that electric charges flow in the body region, and a potential of the second gate electrode is set to be higher as an absolute value than those of potentials of the source layer, drain layer, and first gate electrode so that electric charges flow from the body region, and
   in the data holding state, the memory cell is kept in a stationary state that a first amount of the electric charges flowing in the body region per unit time is substantially the same as a second amount of the electric charges flowing from the body region per unit time.

2. The semiconductor memory device according to claim 1, wherein a difference between the first amount of electric charges and the second amount of electric charges includes two stable stationary points and an unstable stationary point,
   potentials of the body region corresponding to the two stable stationary points exist so as to sandwich a potential of the body region corresponding to the unstable stationary point, and
   one of the two stable stationary states is a stationary state of the memory cell storing data "0" and the other is a stationary state of the memory cell storing data "1".

3. The semiconductor memory device according to claim 1, wherein
   the first amount of electric charges Iin is an amount of electric charges flowing in the body region per unit time, the electric charges of the Iin is caused by an impact ionized current between the body region and the source layer or drain layer,
   the second amount of electric charges Iout is an amount of electric charges of a tunnel current flowing from the second gate electrode through the second gate dielectric film to the body region per unit time, and
   a difference (Iin−Iout) between the current flowing in the body region and the current flowing from the body region changes in the order of positive, negative, positive, and negative or in the order of negative, positive, negative, and positive as the potential of the body region is increased from low to high.

4. The semiconductor memory device according to claim 2, wherein
   the first amount of electric charges Iin is an amount of electric charges flowing in the body region per unit time, the electric charges of the Iin is caused by an impact ionized current between the body region and the source layer or drain layer,
   the second amount of electric charges Iout is an amount of electric charges of a tunnel current flowing from the second gate electrode through the second gate dielectric film to the body region per unit time, and
   a difference (Iin−Iout) between the current flowing in the body region and the current flowing from the body region changes in the order of positive, negative, positive, and negative or in the order of negative, positive, negative, and positive as the potential of the body region is increased from low to high.

5. The semiconductor memory device according to claim 1, wherein potentials of the first and the second gate electrodes are fixed when the data is held, written, and read.

6. The semiconductor memory device according to claim 5 further comprising:
   a source line connected to the source layer; and
   a bit line connected to the drain layer, wherein
   the driver drives selectively the source line at the time of data writing or reading.

7. The semiconductor memory device according to claim 1, wherein a potential difference between the source layer and drain layer of the memory cell selected at the time of data reading is smaller than that of the data holding state.

8. The semiconductor memory device according to claim 1, wherein a potential of the source layer of the memory cell selected during data reading approaches from a potential of the source layer in the data holding state to a potential of the second gate electrode so as to turn on the memory cell.

9. The semiconductor memory device according to claim 8, wherein
after the data is read, the potential of the source layer of the memory cell selected during data writing is closer to the potential of the second gate electrode than the potential of the source layer during data reading so as to discharge the electric charges from the body region of the memory cell, and
after the potential of source layer of the memory cell is returned to the potential of the source layer at the time of data reading, the potential of the drain layer is driven based on the read data such that the electric charges are either supplied in the body region of the memory cell or not.

10. The semiconductor memory device according to claim 1, wherein a potential difference between the first gate electrode and one of the drain layer and the source layer having a potential closer to that of the second gate electrode is smaller in a data holding state of a standby state that accesses do not exist during a predetermined period than in a data holding state of an active state that an interval from an access to the next access is shorter than the predetermined period, and
the potential difference between the first gate electrode and the second gate electrode is smaller in the data holding state of the standby state than in the data holding state of the active state.

11. The semiconductor memory device according to claim 1, wherein
the potential of the first gate electrode is the same for a memory cell array including a plurality of the memory cells, and
the potential of the second gate electrode is the same for the memory cell array.

12. A driving method of a semiconductor memory device comprising: a memory cell including a source layer and a drain layer within a semiconductor layer; an electrically floating body region provided between the source layer and the drain layer in the semiconductor layer; a first gate electrode provided on a first surface of the body region so as to be insulated from the body region; a second gate electrode provided on a second surface of the body region different from the first surface so as to be insulated from the body region,
the method comprising:
setting a potential of the first gate electrode to be higher than one of potentials of the source layer and the drain layer and lower than the other of the potentials of the source layer and the drain layer so that electric charges flow in the body region, and setting a potential of the second gate electrode to be higher as an absolute value than those of potentials of the source layer, drain layer, and first gate electrode so that electric charges flow from the body region, in a data holding state, and
keeping the memory cell in a stationary state that a first amount of the electric charges flowing in the body region per unit time is substantially the same as a second amount of the electric charges flowing from the body region per unit time, in the data holding state.

13. The method according to claim 12, wherein a difference between the first amount of electric charges and the second amount of electric charges includes two stable stationary points and an unstable stationary point,
potentials of the body region corresponding to the two stable stationary points exist so as to sandwich a potential of the body region corresponding to the unstable stationary point, and one of the two stable stationary states is a stationary state of the memory cell storing data "0" and the other is a stationary state of the memory cell storing data "1".

14. The method according to claim 12, wherein
the first amount of electric charges Iin is an amount of electric charges flowing in the body region per unit time, the electric charges of the Iin is caused by an impact ionized current between the body region and the source layer or drain layer,
the second amount of electric charges Iout is an amount of electric charges of a tunnel current flowing from the second gate electrode through a second gate dielectric film to the body region per unit time, and
a difference (Iin−Iout) between the current flowing in the body region and the current flowing from the body region changes in the order of positive, negative, positive, and negative or in the order of negative, positive, negative, and positive as the potential of the body region is increased from low to high.

15. The method according to claim 12, wherein potentials of the first and the second gate electrodes are fixed when data is held, written, and read.

16. The method according to claim 12, wherein a potential difference between the source layer and drain layer of the memory cell selected at the time of data reading is smaller than that of the data holding state.

17. The method according to claim 12, wherein a potential of the source layer of the memory cell selected during data reading approaches from a potential of the source layer in the data holding state to a potential of the second gate electrode so as to turn on the memory cell.

18. The method according to claim 17, wherein
after the data is read, the potential of the source layer of the memory cell selected during data writing is closer to the potential of the second gate electrode than the potential of the source layer during data reading so as to discharge the electric charges from the body region of the memory cell, and
after the potential of source layer of the memory cell is returned to the potential of the source layer at the time of data reading, the potential of the drain layer is driven based on the read data such that the electric charges are either supplied in the body region of the memory cell or not.

19. The method according to claim 12, wherein a potential difference between the first gate electrode and one of the drain layer and the source layer having a potential closer to that of the second gate electrode is smaller in a data holding state of a standby state that accesses do not exist during a predetermined period than in a data holding state of an active state that an interval from an access to the next access is shorter than the predetermined period, and
the potential difference between the first gate electrode and the second gate electrode is smaller in the data holding state of the standby state than in the data holding state of the active state.

20. The method according to claim 12, wherein
the potential of the first gate electrode is the same for a memory cell array including a plurality of the memory cells, and
the potential of the second gate electrode is the same for the memory cell array.

* * * * *